United States Patent
Horikoshi et al.

(10) Patent No.: US 9,559,141 B2
(45) Date of Patent: Jan. 31, 2017

(54) MANUFACTURING METHOD OF USING HYDROGEN PLASMA PROCESSING ON A SEMICONDUCTOR WAFER

(71) Applicant: Renesas Electronics Corporation, Koutou-ku, Tokyo (JP)

(72) Inventors: Kotaro Horikoshi, Ibaraki (JP); Tatsunori Murata, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/829,581

(22) Filed: Aug. 18, 2015

(65) Prior Publication Data

US 2016/0064450 A1    Mar. 3, 2016

(30) Foreign Application Priority Data

Aug. 26, 2014  (JP) ................. 2014-171554

(51) Int. Cl.
    *H01L 21/302*      (2006.01)
    *H01L 21/461*      (2006.01)
    *H01L 27/146*      (2006.01)

(52) U.S. Cl.
    CPC ... *H01L 27/14689* (2013.01); *H01L 27/14636* (2013.01)

(58) Field of Classification Search
    CPC ............. H01L 21/2236; H01L 21/3003; H01L 21/3006
    See application file for complete search history.

(56) References Cited

U.S. PATENT DOCUMENTS

2009/0152686 A1*  6/2009  Ide ................. C23C 16/401
                                                 257/632

FOREIGN PATENT DOCUMENTS

| JP | 3535876 B2 | 6/2004 |
| JP | 2010-010578 A | 1/2010 |
| JP | 5022900 B2 | 9/2012 |

* cited by examiner

*Primary Examiner* — Hoai V Pham
(74) *Attorney, Agent, or Firm* — Shapiro, Gabor and Rosenberger, PLLC

(57) ABSTRACT

Hydrogen plasma processing is performed on a semiconductor wafer having a wiring formed in a region except a photodiode formation region of a pixel part and in a peripheral circuit part, from the side of a face where the wiring is formed. The hydrogen plasma processing uses a plasma etching apparatus which applies high-frequency power to an upper electrode for exciting hydrogen plasma and applies high-frequency power to a lower electrode for supplying hydrogen ions existing in the hydrogen plasma to the semiconductor wafer by electric field drift. Thereby, in the photodiode formation region of the pixel part, hydrogen ions become likely to be supplied by the electric field drift, and, in the region except the photodiode formation region and in the peripheral circuit part, the wiring restricts the movement of hydrogen ions and hydrogen ions become difficult to be supplied.

9 Claims, 21 Drawing Sheets

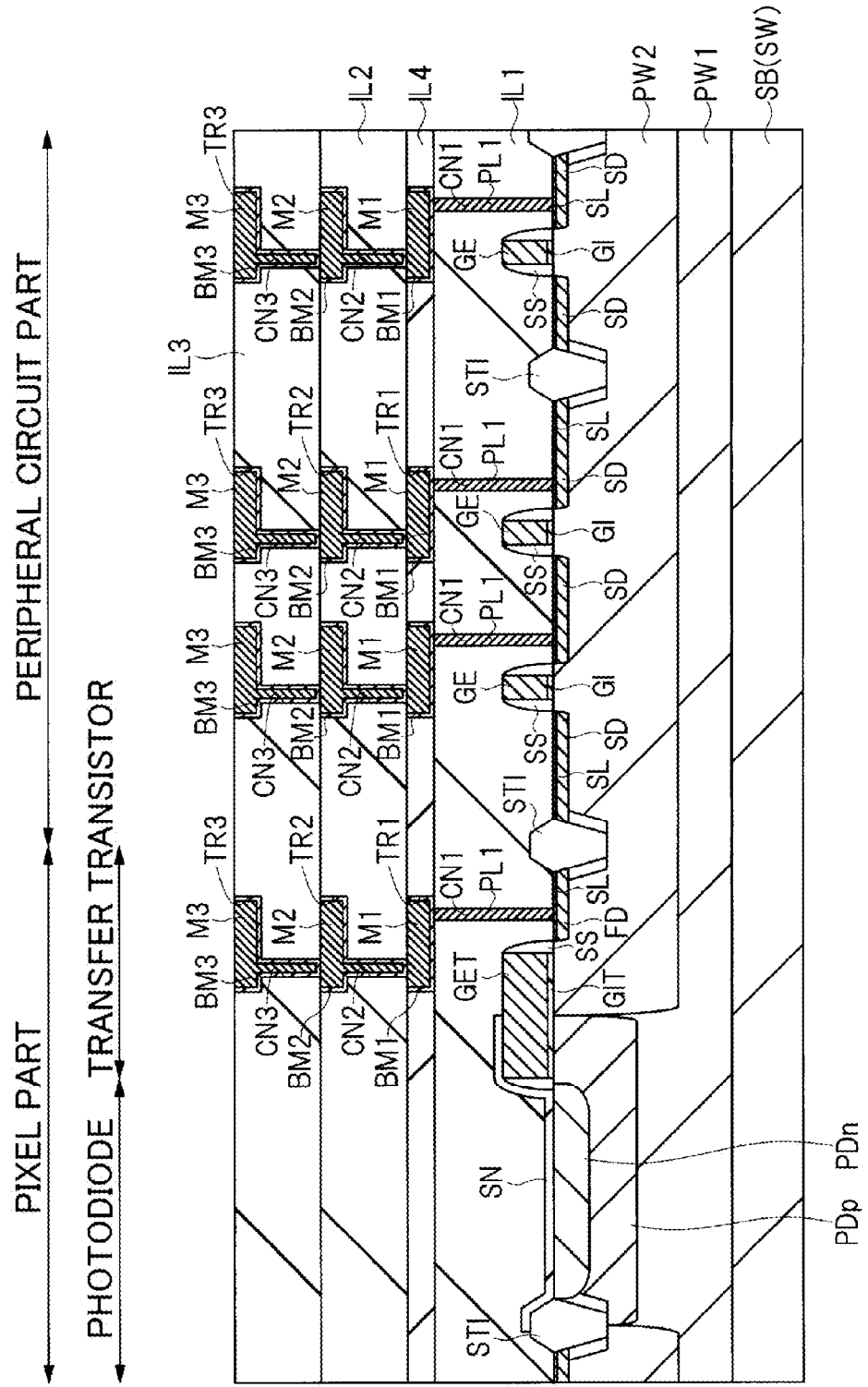

MANUFACTURING METHOD OF USING HYDROGEN PLASMA PROCESSING ON A SEMICONDUCTOR WAFER

CROSS-REFERENCE TO RELATED APPLICATION

The disclosure of Japanese Patent Application No. 2014-171554 filed on Aug. 26, 2014 including the specification, drawings and abstract is incorporated herein by reference in its entirety.

BACKGROUND

The present invention relates to a semiconductor device manufacturing technique, and can be suitably applied to manufacture of a semiconductor device incorporating a CMOS (Complementary Metal Oxide Semiconductor) image sensor, a nonvolatile semiconductor memory, or the like, for example.

For example, Japanese Patent No. 3535876 (patent literature 1) describes a technique of terminating dangling bonds at the interface between an insulating film and a semiconductor by bringing the insulating film into contact with hydrogen active species not accompanied by plasma so as to perform sintering.

Further, Japanese Patent Laid-Open No. 2010-10578 (patent literature 2) describes a technique of supplying hydrogen to the interface between the semiconductor substrate and an oxide film by forming a surface protection film over a device formation layer after the formation of the device formation layer, and ion-implanting hydrogen to a face opposite to a face, of a semiconductor substrate, where the device formation layer is formed.

Further, Japanese Patent No. 5022900 (patent literature 3) describes a technique of forming a barrier film over a Cu wiring by plasma-decomposing ammonia and silane-based gas.

SUMMARY

In a semiconductor device incorporating a CMOS image sensor, for example, there has been studied a technique of terminating with hydrogen dangling bonds existing at the interface between a semiconductor substrate and an insulating film formed over the semiconductor substrate, for reducing dark current (noise current) in a photodiode of a pixel part.

When the technique described in above patent literature 1 or 2 is applied, however, since hydrogen is supplied to the whole interface between the semiconductor substrate and the insulating film, the hydrogen is accumulated also at the interface between the semiconductor substrate and the insulating film in a region where it is not desirable to supply the hydrogen, and sometimes a failure occurs in the semiconductor device. For example, when hydrogen is accumulated at the interface between the semiconductor substrate and the insulating film in a peripheral circuit part of a semiconductor device incorporating a CMOS image sensor, sometimes a trap level is generated and a threshold voltage changes in a field effect transistor configuring the peripheral circuit part. Accordingly, there is required a technique of selectively terminating with hydrogen the interface between the semiconductor substrate and the insulating film.

The other problems and the new feature will become clear from the description of the present specification and the accompanying drawings.

According to an embodiment, in a manufacturing method of a semiconductor device incorporating a CMOS image sensor, hydrogen plasma processing is performed, from the side of a face where a wiring is formed, on a semiconductor wafer where a wiring is formed in a region except a photodiode formation region of a pixel part and in a peripheral circuit part. The hydrogen plasma processing uses a plasma etching apparatus which includes an upper electrode and a lower electrode, and applies a high-frequency power to the upper electrode for exciting hydrogen plasma and applies a high-frequency power to the lower electrode for supplying hydrogen ions existing in the hydrogen plasma to the semiconductor wafer by electric field drift. Thereby, hydrogen ions become likely to be supplied by the electric field drift to the interface between a semiconductor substrate and an insulating film in the photodiode formation region of the pixel part, and the wiring restricts the movement of hydrogen ions and the hydrogen ions become difficult to be supplied to the interface between the semiconductor substrate and the insulating film in the region except the photodiode formation region of the pixel part and in the peripheral circuit part.

According to an embodiment, in the semiconductor device incorporating the CMOS image sensor, it is possible to selectively terminate with hydrogen the dangling bonds existing in the interface between the semiconductor substrate and the insulating film formed over the semiconductor substrate.

BRIEF DESCRIPTION OF THE DRAWINGS

FIG. 4A is a graph showing a hydrogen spectrum in each of the samples, and FIG. 4B is a graph showing a hydrogen spectrum integration value in the range of 100° C. to 1,000° C. in each of the samples;

FIG. 21 is a relevant cross-sectional view following FIG. 20, showing a manufacturing step of a semiconductor device.

DETAILED DESCRIPTION

Figure 1:
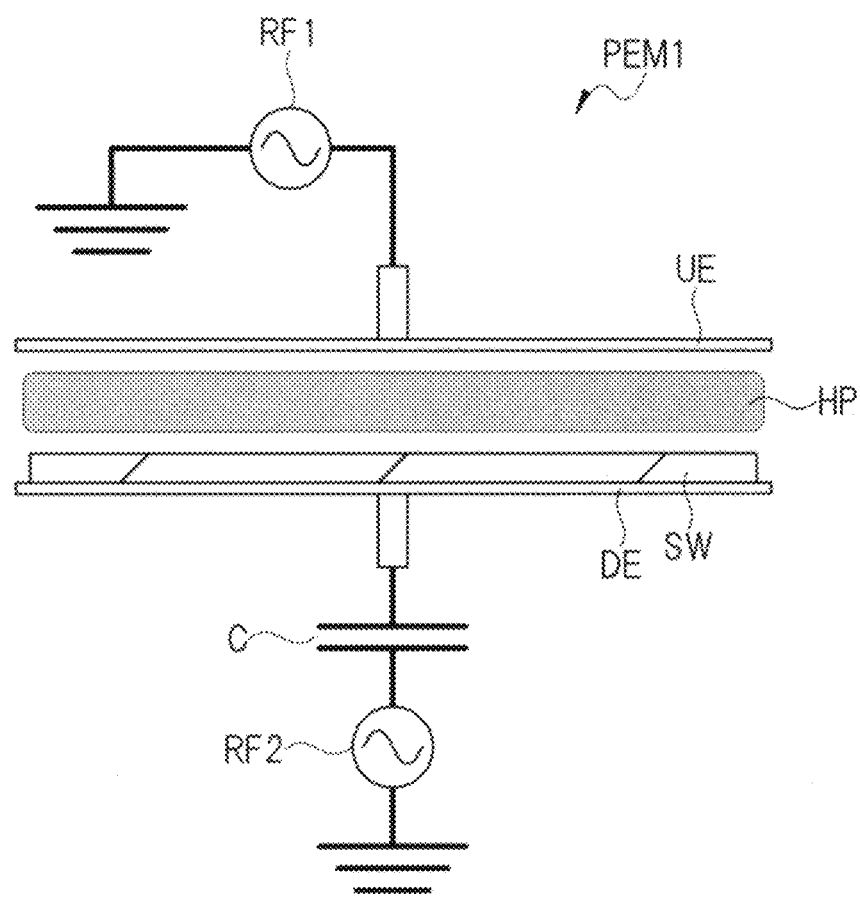
FIG. 1 is a schematic diagram showing an example of a plasma etching apparatus used in hydrogen plasma processing according to a first embodiment.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numerical value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step, etc.) is not necessarily indispensable, except for the case where it is clearly specified in particular and where it is considered to be clearly indispensable from a theoretical point of view, etc.

Further, when mentioning "including A", "formed of A", "having A", and "containing A", obviously another element is not excluded, except for the case where only the element is specified clearly in particular and the like. Similarly, in the following embodiments, when referring to the shape, a positional relationship, or the like of an element or the like, what resembles or is similar substantially to the shape or the like shall be included, except for the case where it is clearly specified in particular and where it is clearly considered otherwise theoretically, and the like. This also applies to the numerical value and range described above.

Further, in the drawings for explaining the embodiments, sometimes hatching is provided even for a plan view for easy viewing. Further, in all the drawings for explaining the following embodiments, the same symbol is attached to an element having the same function, and the repeated explanation thereof will be omitted. Hereinafter, the present embodiments will be explained in detail by the use of the drawings.

First Embodiment

Plasma Etching Apparatus

Figure 2:
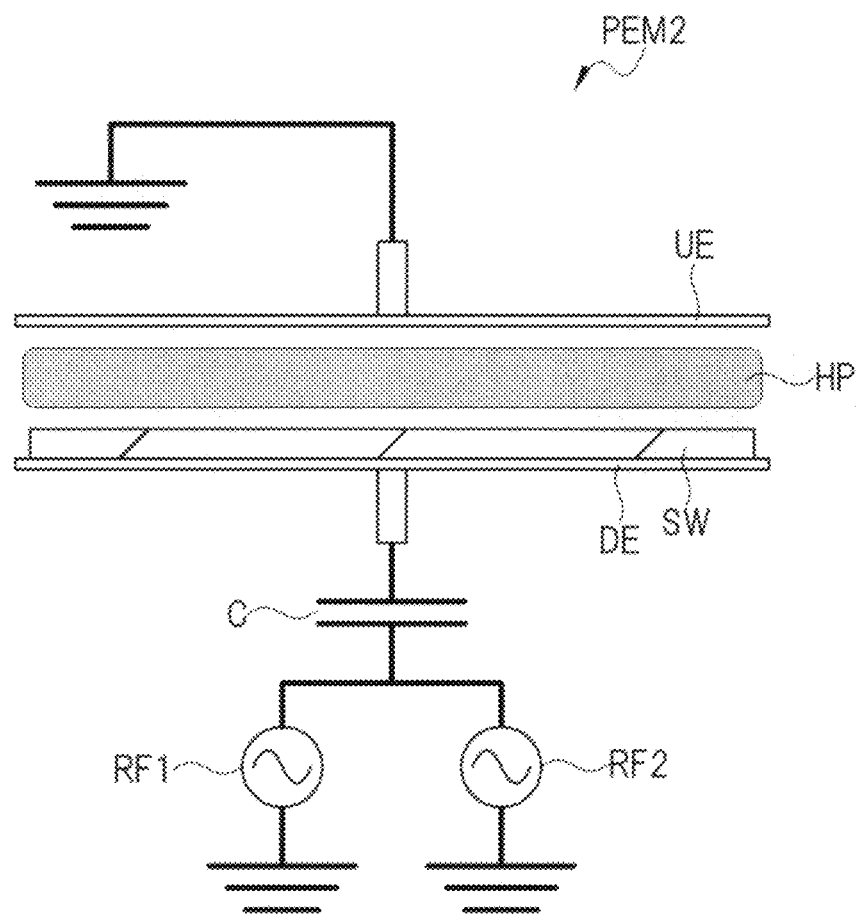
FIG. 2 is a schematic diagram showing a variation example of the plasma etching apparatus used in the hydrogen plasma processing according to the first embodiment.
Figure 3:
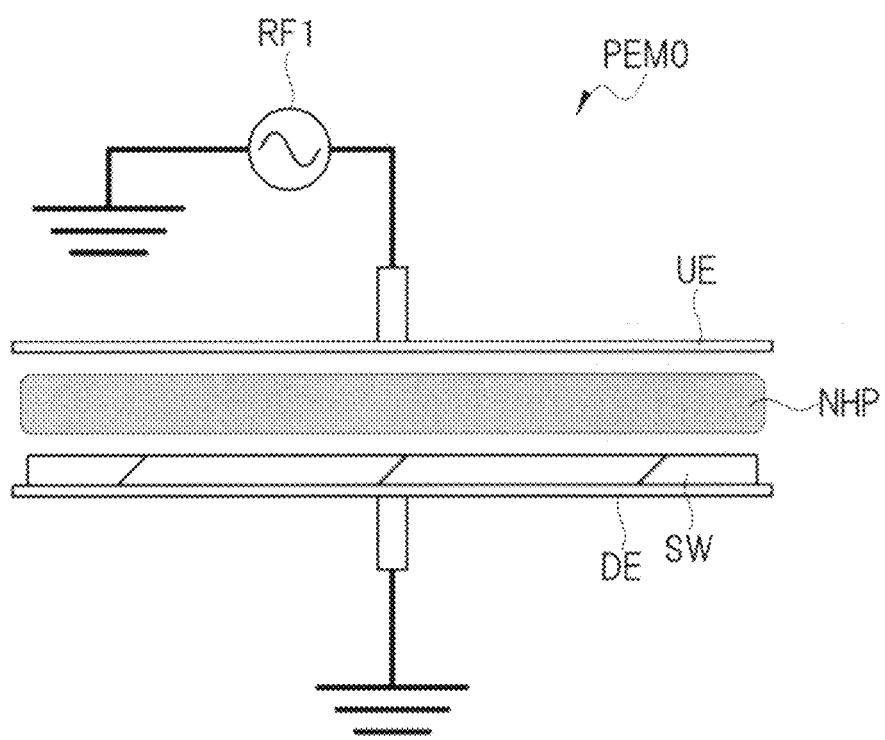
FIG. 3 is a schematic diagram showing an example of a plasma etching apparatus which the present inventors et al. have studied for comparison.

First, there will be explained a plasma etching apparatus used in hydrogen plasma processing according to the present first embodiment. FIG. 1 is a schematic diagram showing an example of the plasma etching apparatus used in the hydrogen plasma processing according to the present first embodiment. FIG. 2 is a schematic diagram showing a variation example of the plasma etching apparatus used in the hydrogen plasma processing according to the present first embodiment. FIG. 3 is a schematic diagram showing an example of a plasma etching apparatus which the present inventors et al. have studied for comparison.

As shown in FIG. 1, a plasma etching apparatus PEM1 includes an upper electrode UE and a lower electrode DE. A first high-frequency power supply RF1 for applying a high-frequency power of 27 MHz to 60 MHz is connected between the upper electrode UE and the earth potential, and a second high-frequency power supply RF2 for applying a high-frequency power of 2 MHz to 27 MHz via a capacitor C is connected between the lower electrode DE and the earth potential. A high-frequency electric field is generated between the upper electrode UE and the lower electrode DE by use of the first high-frequency power supply RF1 connected to the upper electrode UE, and hydrogen plasma HP can be generated by this high-frequency electric field.

A semiconductor wafer SW is mounted over the lower electrode DE with a face opposite to a major face thereof (device formation face) in contact with the lower electrode DE, and the major face of the semiconductor wafer SW is exposed to the hydrogen plasma HP.

Further, the plasma etching apparatus PEM1 can control the voltage of plasma sheath (electrostatic sheath) formed between the major face of the semiconductor wafer SW and the hydrogen plasma HP using the second high-frequency power supply RF2 connected to the lower electrode DE. Thereby, it is possible to move hydrogen ions existing in the hydrogen plasma HP by an electric field, vertically to the major face of the semiconductor wafer SW (in the following, called electric field drift) and to pull the hydrogen ions onto the major face of the semiconductor wafer SW.

The condition of the hydrogen plasma processing can be exemplified as follows; gas pressure: 20 mT to 100 mT, power of the first high-frequency power supply RF1 (upper electrode UE): 200 W to 5,000 W, power of the second high-frequency power supply RF2 (lower electrode DE): 200 W to 5,000 W, and temperature of the semiconductor wafer SW: 0° C. to 60° C., for example.

Note that, while an insulating film formed on the major face of the semiconductor wafer SW is etched by the hydrogen plasma HP, the etching speed thereof is approximately 2 to 3 nm/min, and therefore it is possible to pull the hydrogen ions onto the major face of the semiconductor wafer SW without causing the loss of the insulating film by the etching.

Further, as shown in FIG. 2, it is also possible to use a plasma etching apparatus PEM2 in which the first high-frequency power supply RF1 and the second high-frequency power supply RF2 are connected between the lower electrode DE and the earth potential via the capacitor C. In this case, the upper electrode UE is connected to the earth potential. A high-frequency electric field is generated between the upper electrode UE and the lower electrode DE by the use of the first high-frequency power supply RF1 connected to the lower electrode DE, and the hydrogen plasma HP can be generated by the high-frequency electric field.

Moreover, the voltage of the plasma sheath formed between the major face of the semiconductor wafer SW; and the hydrogen plasma HP can be controlled by the use of the second high-frequency power supply RF2 connected to the lower electrode DE. Thereby, it is possible to pull hydrogen ions existing in the hydrogen plasma HP onto the major face of the semiconductor wafer SW by the electric field drift.

FIG. 3 shows a plasma etching apparatus PEM0 which the inventors et al. have studied for comparison. The plasma etching apparatus PEM0 includes an upper electrode UE and a lower electrode DE, and a first high-frequency power supply RF1 for applying high-frequency power of 27 MHz to 60 MHz is connected to the upper electrode UE and the earth potential is connected to the lower electrode DE. As in the above plasma etching apparatus PEM1, a high-frequency electric field is generated between the upper electrode UE and the lower electrode DE by the use of the first high-frequency power supply RF1 connected to the upper electrode UE, and ammonia plasma NHP can be generated by this high-frequency electric field.

In the plasma etching apparatus PEM0, however, while hydrogen ions existing in the ammonia plasma NHP can be diffused onto the semiconductor wafer SW, it is not possible to pull the hydrogen ions onto the major face of the semiconductor wafer SW by the electric field drift.

<Effect of Hydrogen Ion Implantation>

Figure 4A:
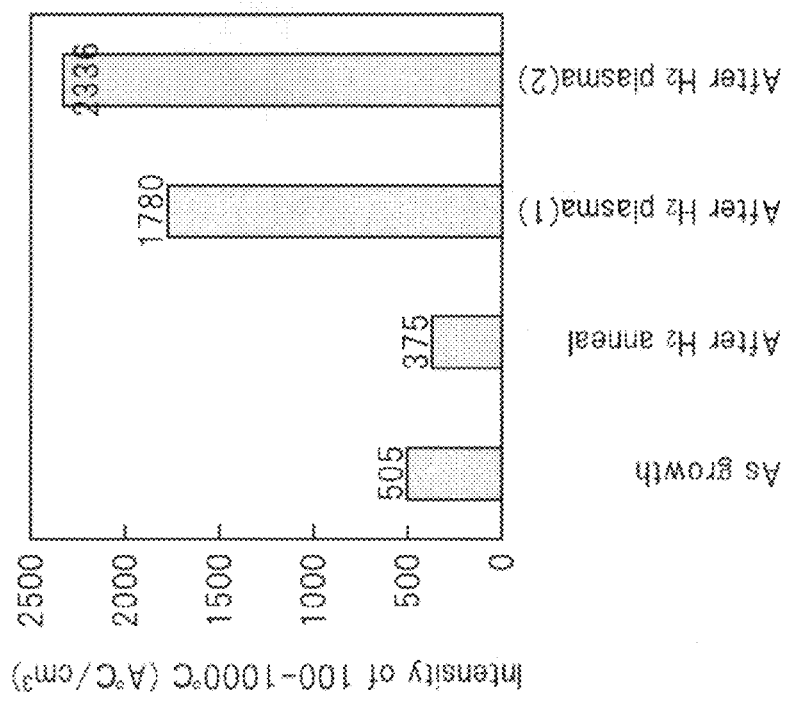
FIGS. 4A and 4B are graphs showing a TDS analysis result of hydrogen gas in a sample not subjected to hydrogen treatment (As growth) and samples subjected to hydrogen treatment (hydrogen anneal processing (After $H_2$ anneal) and hydrogen plasma processing (After $H_2$ plasma (1) and After $H_2$ plasma (2)).
Figure 4B:
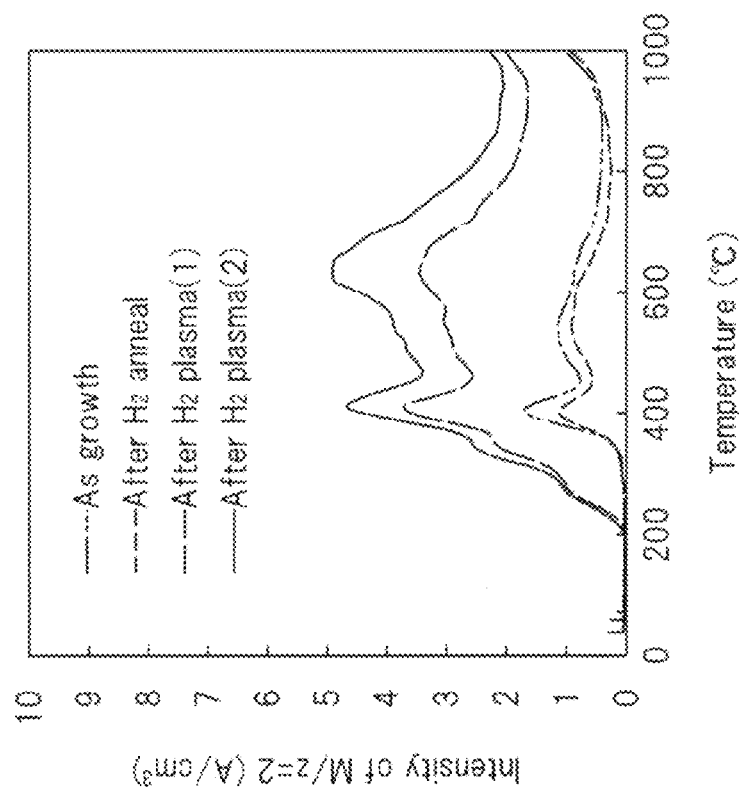
Figure 5:
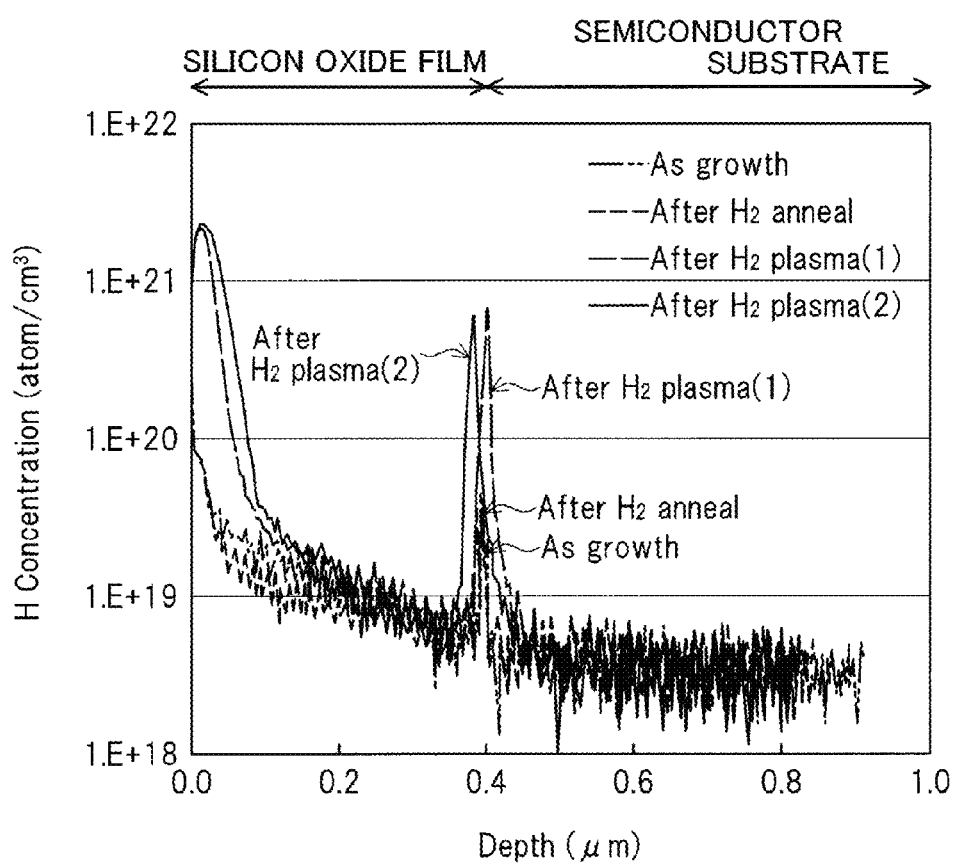
FIG. 5 is a graph showing a SIMS analysis result of hydrogen ion concentrations in a sample not subjected to hydrogen treatment (As growth) and samples subjected to hydrogen treatment (hydrogen anneal processing (After $H_2$ anneal) and hydrogen plasma processing (After $H_2$ plasma (1) and After $H_2$ plasma (2))
Figure 6A:
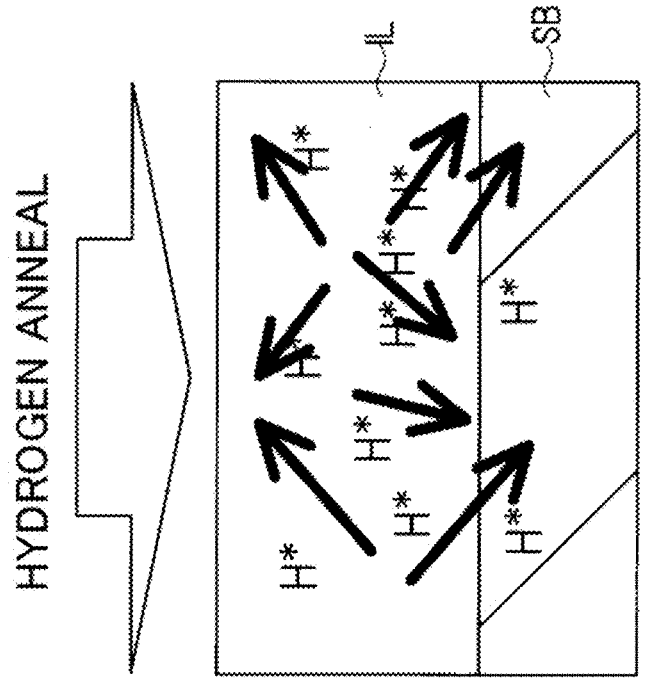
FIGS. 6A and 6B are schematic diagrams explaining hydrogen ion supply models in hydrogen plasma processing and hydrogen anneal processing, respectively.
Figure 6B:
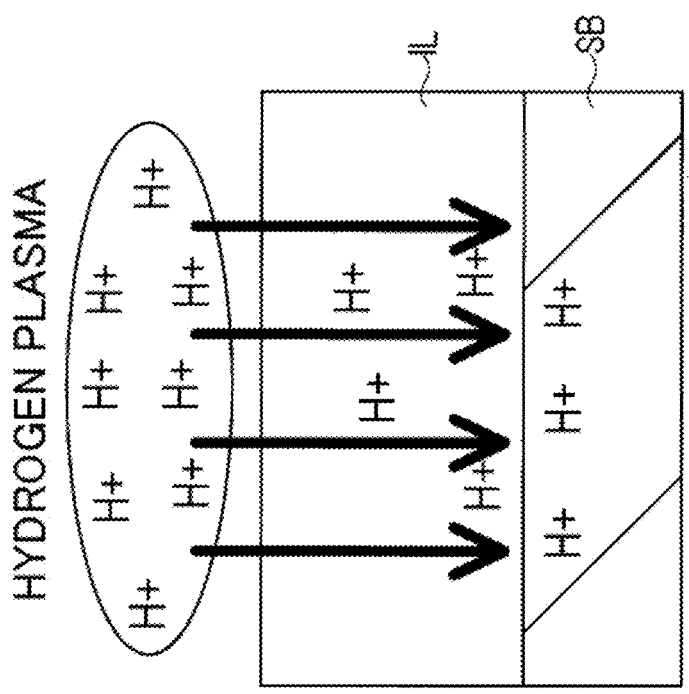

Next, there will be explained the effect of hydrogen ion implantation into the interface between a semiconductor substrate and an insulating film formed over the semiconductor substrate, by the use of FIGS. 4A and 4B, FIG. 5 and FIGS. 6A and 6B. FIGS. 4A and 4B show a TDS (Thermal Desorption Spectroscopy) analysis result of hydrogen gas in each of samples. FIG. 4A is a graph showing a hydrogen spectrum in each of the samples, and FIG. 4B is a graph showing a hydrogen spectrum integration value in the range of 100° C. to 1,000° C. in each of the samples. FIG. 5 is a graph showing a SIMS (Secondary Ion Mass Spectroscopy) analysis result of hydrogen ion concentration in each of the samples. FIGS. 6A and 6B are schematic diagrams explaining hydrogen ion supply models in the hydrogen plasma processing and hydrogen anneal processing, respectively.

The analysis was performed by the use of a sample configured with a semiconductor substrate made of silicon and a silicon oxide film formed over the semiconductor substrate by thermal oxidation method. The thickness of the silicon oxide film is approximately 400 nm. The hydrogen anneal processing (415° C., 2 hours) and first plasma processing or second plasma processing were performed on this sample. The condition of the first plasma processing was as follows; hydrogen gas flow rate: 500 sccm, gas pressure: 70 mT, frequency/power of the first high-frequency power supply: 27 MHz/400 W, frequency/power of the second high-frequency power supply: 2 MHz/500 W, and processing time: 300 sec. Further, the condition of the second plasma processing was as follows; argon gas flow rate/ hydrogen gas flow rate: 100 sccm/400 sccm, gas pressure: 70 mT, frequency/power of the first high-frequency power supply: 27 MHz/500 W, frequency/power of the second high-frequency power supply: 2 MHz/1,500 W, and processing time: 300 sec. The power of the second high-frequency power supply was 500 W in the first plasma processing, the power of the second high-frequency power supply was 1,500 W in the second plasma processing, and a higher power was set in the second plasma processing than in the first plasma processing. Here, argon gas was added in the second plasma processing for plasma stabilization.

As shown in FIGS. 4A and 4B, a larger hydrogen desorption amount was observed in the sample (After $H_2$ plasma (1)) subjected to the first plasma processing (low power) and the sample (After $H_2$ plasma (2)) subjected to the second plasma processing (high power) than in the sample (After $H_2$ anneal) subjected to the hydrogen anneal processing.

Further, as shown in FIG. 5, the hydrogen ion concentration at the interface between the semiconductor substrate and the silicon oxide film is not lower than $10^{20}$ cm$^{-3}$ in each of the sample (After $H_2$ plasma (1)) subjected to the first plasma processing (low power) and the sample (After $H_2$ plasma (2)) subjected to the second plasma processing (high power). On the other side, the hydrogen ion concentration at the interface between the semiconductor substrate and the silicon oxide film is lower than $10^{20}$ cm$^{-3}$ in the sample (After $H_2$ anneal) subjected to the hydrogen anneal processing. That is, the hydrogen ion concentration at the interface between the semiconductor substrate and the silicon oxide film in each of the sample (After $H_2$ plasma (1)) subjected to the first plasma processing (low power) and the sample (After $H_2$ plasma (2)) subjected to the second plasma processing (high power) is higher than that of the sample (After $H_2$ anneal) subjected to the hydrogen anneal processing, and it is found that more hydrogen is accumulated in the former cases.

There will be explained hydrogen ion supply models surmised from the analysis results of FIGS. 4A and 4B and FIG. 5 in the hydrogen plasma processing and the hydrogen anneal processing, by the use of FIGS. 6A and 6B, respectively.

As shown in FIG. 6A, in the hydrogen plasma processing, it is considered that the electric field is increased in the plasma sheath formed between the insulating film IL and the hydrogen plasma to allow hydrogen ions supplied into the insulating film IL to move easily. Accordingly, in the sample subjected to the hydrogen plasma processing, hydrogen ions move easily in the insulating film IL and a large amount of hydrogen ions can be accumulated at the interface between the semiconductor substrate SB and the insulating film IL, and therefore, even if a large amount of dangling bonds exist at the interface between the semiconductor substrate SB and the insulating film IL, most of the dangling bonds can be terminated with hydrogen.

On the other side, as shown in FIG. 6B, while the hydrogen ions are supplied into the insulating film IL also in the hydrogen anneal processing, it is considered that the hydrogen ions move in the insulating film IL by thermal diffusion and therefore a small amount of hydrogen ions move to the interface between the semiconductor substrate SB and the insulating film IL to be accumulated there. Therefore, in the sample subjected to the hydrogen anneal processing, if a large amount of dangling bonds exist at the interface between the semiconductor substrate SB and the insulating film IL, many dangling bonds remain without the termination with hydrogen.

<Manufacturing Method of a CMOS Image Sensor>

Figure 7:
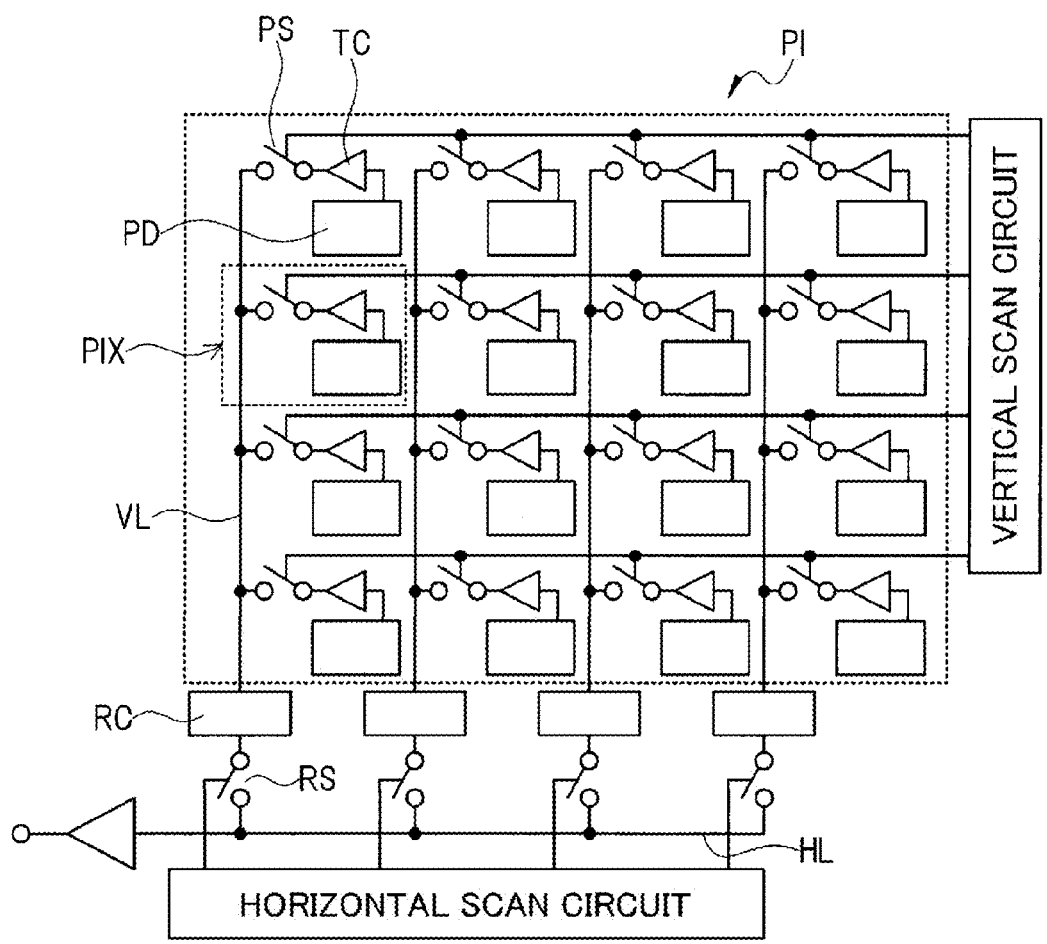
FIG. 7 is a plan view showing a CMOS image sensor.
Figure 8B:
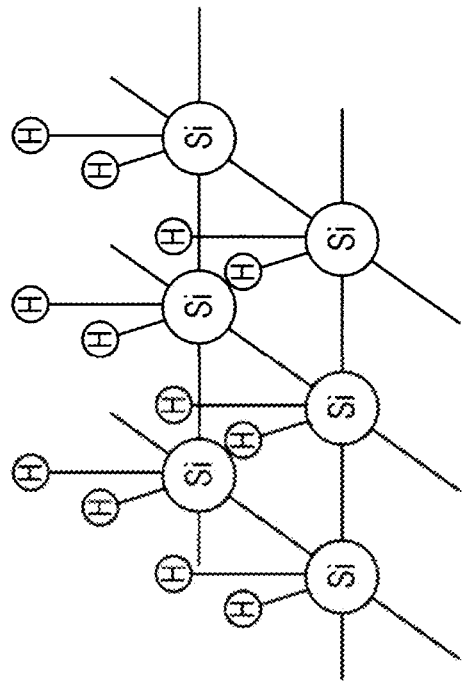
FIGS. 8A and 8B are an image diagram showing a path of current flowing via dangling bonds at the interface between a semiconductor substrate and an insulating film, and an image diagram showing a state in which dangling bands are terminated with hydrogen at the interface between a semiconductor substrate and an insulating film, respectively.
Figure 8A:
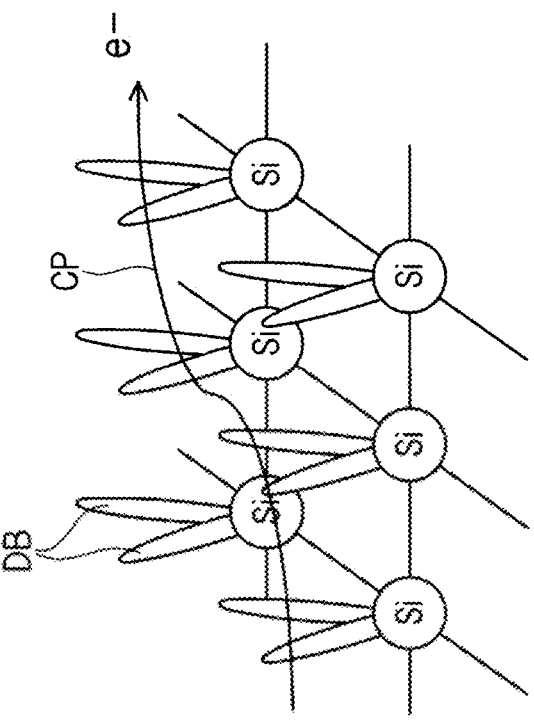

FIG. 7 is a plan view showing a CMOS image sensor. FIGS. 8A and 8B are an image diagram showing a path of current flowing at the interface between the semiconductor substrate and the insulating film via the dangling bonds and an image diagram showing a state in which the dangling bonds are terminated with hydrogen at the interface between the semiconductor substrate and the insulating film, respectively.

As shown in FIG. 7, a plurality of pn-junction type photodiodes PD is arranged in an array in the pixel part PI.

In the following, there will be explained simply a read method of the CMOS image sensor. First, (1) the photodiode PD within a pixel PIX receives light, converts the light into charge, and accumulates the charge. (2) The accumulated charge is converted into voltage and the voltage is amplified by a voltage conversion circuit TC within the pixel PIX. (3) The amplified voltage is transferred to a vertical signal line VL by ON/OFF of a pixel selection switch PS, in each line (each row) (line exposure sequential read). (4) A column circuit RC arranged for each vertical signal line VL removes noise which varies among the pixels PIX and stores the voltage temporarily. (5) The stored voltage is sent to a horizontal signal line HL by ON/OFF of a column selection switch RS. Then, the voltage is read by the peripheral circuit part through the horizontal signal line HL.

Meanwhile, as shown in FIG. 8A, in a region where the photodiodes PD of the pixel part are formed, a large number of dangling bonds DB exist at the interface between the semiconductor substrate and the insulating film formed over the semiconductor substrate. Then, when a current path CP is generated by surface electron levels caused by the dangling bonds DB, dark current flows.

Accordingly, as shown in FIG. 8B, hydrogen ions are supplied to terminate the dangling bonds DB with hydrogen, and thereby the surface electron levels are eliminated. If the surface electron levels are eliminated, the current path CP is not generated and the dark current is reduced in the region where the photodiodes PD of the pixel part are formed. Since a large amount of hydrogen ions can be supplied to the interface between the semiconductor substrate and the insulating film in the hydrogen plasma processing using the above plasma etching apparatus PEM1 or PEM2, the hydrogen plasma processing is an effective method for terminating the dangling bonds DB with hydrogen.

When hydrogen ions are supplied to the region except the region where the photodiodes PD of the pixel part are formed and to the peripheral circuit part, however, the hydrogen ions form trap levels at the interface between the semiconductor substrate and the insulating film to cause a problem such as the change in the threshold voltage of a field effect transistor configuring the peripheral circuit part, for example. Accordingly, there is required a technique of selectively terminating the dangling bonds with hydrogen as follows. That is, while hydrogen ions are supplied to the interface between the semiconductor substrate and the insulating film and the dangling bonds are terminated with hydrogen in the region where the photodiodes PD of the pixel part are formed, hydrogen ions are not supplied to the interface between the semiconductor substrate and the insulating film in the region except the region where the photodiodes PD of the pixel part are formed and in the peripheral circuit part.

In the following, the pixel part and the peripheral circuit part according to the present first embodiment will be exemplified and a manufacturing method of a semiconductor device will be explained in the process order by the use of FIG. 9 to FIG. 18. FIG. 9 to FIG. 18 are relevant cross-sectional views showing manufacturing steps of the semiconductor device according to the present first embodiment. Here, in the pixel part, there will be explained manufacture of the photodiode within one pixel and a transfer transistor which functions as a switch when signal charge is transferred. Further, while each of an n-channel type MISFET (Metal Insulator Semiconductor Field Effect Transistor) and a p-channel type MISFET is manufactured in the peripheral circuit part as a MISFET representing field effect transistors, here, the manufacture of the n-channel type MISFET will be explained.

Figure 9:
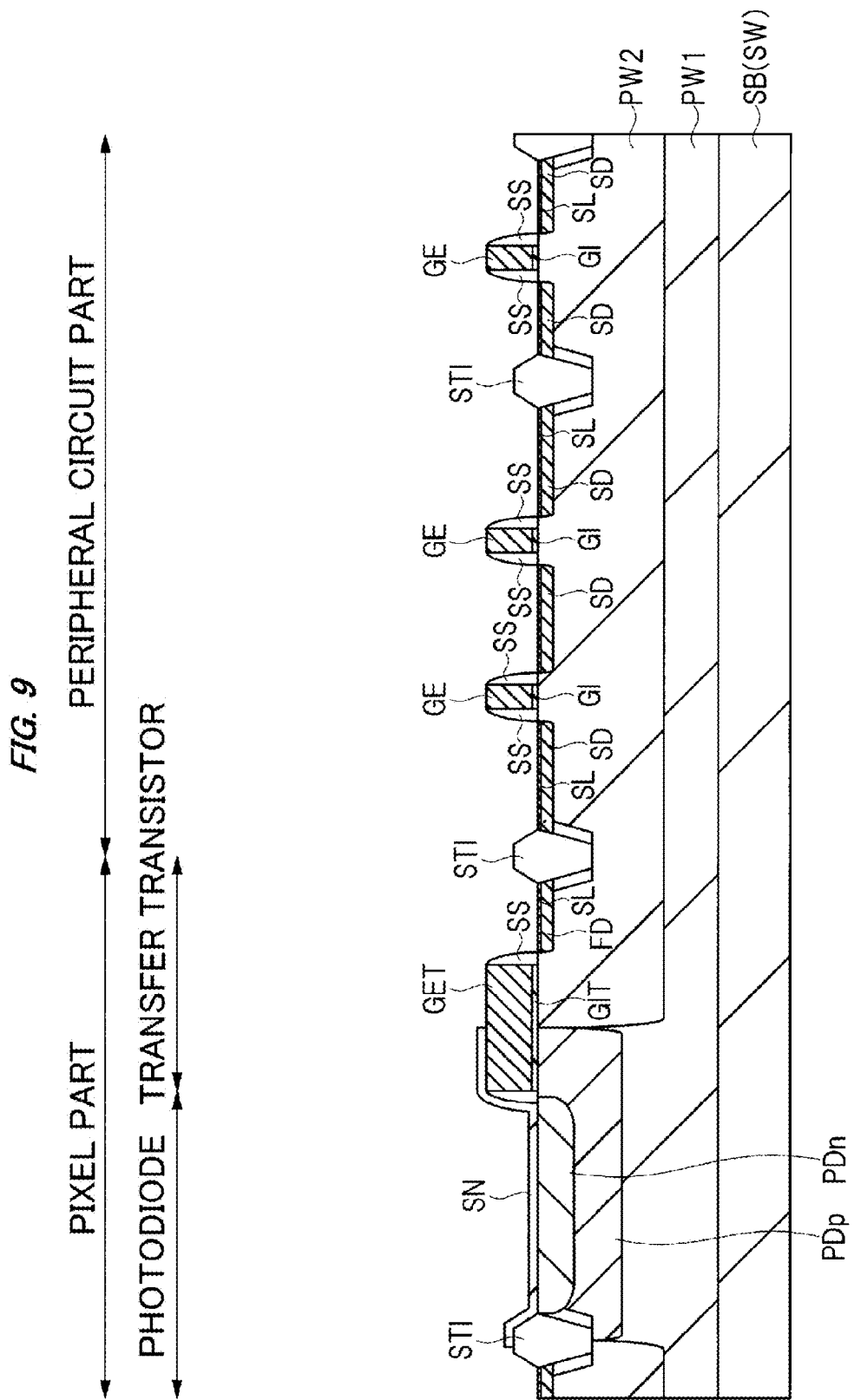
FIG. 9 is a relevant cross-sectional view showing a manufacturing step of a semiconductor device according to a first embodiment.

First, as shown in FIG. 9, the semiconductor substrate (semiconductor thin plate having an approximately circular plane, called semiconductor wafer SW) SB made of single crystal silicon is prepared.

Next, an element separation part STI made of an insulating film is formed on the semiconductor substrate SB. The element separation part STI is an inactive region separating a plurality of active regions from each other. That is, the shape of the active region in a plan view is defined by being surrounded by the element separation part STI.

In the step of forming the element separation part STI, first a hard mask pattern made of silicon nitride is formed over the semiconductor substrate SB, and a plurality of trenches is formed in the semiconductor substrate SB by dry etching using this hard mask pattern as a mask. Subsequently, after a liner oxide film has been formed on the inside walls (side faces and bottom faces) of the trenches, an insulating film made of silicon oxide, for example, is formed over the semiconductor substrate SB including the insides of the trenches by CVD (Chemical Vapor Deposition) method, for example. Next, the upper face of this insulating film is polished by a CMP (Chemical Mechanical Polishing) method, for example, and the insulating film is left inside the trenches. After that, the hard mask pattern is removed. Thereby, the element separation part STI is formed.

Next, p-type impurities, for example, boron, are ion-implanted in the major face of the semiconductor substrate SB, and a first p-type well PW1 is formed in the pixel part and the peripheral circuit part. Subsequently, p-type impurities, for example, boron, are ion-implanted in the major face of the semiconductor substrate SB in a part of a transfer transistor formation region of the pixel part and in the peripheral circuit part to form a second p-type well PW2. The second p-type well PW2 is integrally formed in the part of the transfer transistor formation region of the pixel part and in the peripheral circuit part. Subsequently, p-type impurities, for example, boron, are ion-implanted in the major face of the semiconductor substrate SB in the other part of the transfer transistor formation region of the pixel part and in a photodiode formation region to form a p-type region PDp. The p-type region PDp is integrally formed in the other part of the transfer transistor formation region of the pixel part and in the photodiode formation region. Further, an electric field relaxation layer may be formed in the semiconductor substrate SB around the element separation part STI (second p-type well PW2 and p-type region PDp).

Next, after a silicon oxide film and a poly-silicon film in which n-type impurities are introduced have been formed sequentially over the major face of the semiconductor substrate SB, the poly-silicon film and the silicon oxide film are processed sequentially by etching using a resist patter as a mask. Thereby, a gate electrode GET and a gate insulating film GIT of the transfer transistor are formed in the transfer transistor formation region of the pixel part, and a gate electrode GE and a gate insulating film GI of the n-channel type MIS transistor are formed in the peripheral circuit part. Here, the gate electrode GET of the transfer transistor is formed over the second p-type well PW2 on one side in the gate length direction, and formed over the p-type region PDp on the other side in the gate length direction. That is, the gate electrode GET of the transfer transistor is formed so as to straddle the second p-type well PW2 and the p-type region PDp when viewed along the gate length direction. Note that each of the gate electrodes GE and GET may be configured with a stacked film stacking a poly-silicon film and a silicide film sequentially from the lower layer, or a stacked film stacking a poly-silicon film and a metal film sequentially from the lower layer.

Next, n-type impurities, for example, arsenide or phosphor, are ion-implanted in the major face of the semiconductor substrate SB in the pixel part to form an n-type region PDn in the p-type region PDp on one side of the gate electrode GET in the transfer transistor, that is, in the photodiode formation region. Thereby, a pn-junction part configuring the photodiode and including the n-type region PDn and the p-type region PDp is formed on one side of the semiconductor substrate SB with the gate electrode GET of the transfer transistor therebetween.

Next, after a silicon nitride film has been deposited over the major surface of the semiconductor substrate SB, a resist pattern is formed so as to cover the photodiode formation region of the pixel part, and the silicon nitride film is etched anisotropically by an RIE (Reactive Ion Etching) method, for example, with this resist pattern as a mask. Thereby, a silicon nitride film SN is formed so as to cover the photodiode formation region of the pixel part and the side wall of the gate electrode GET on the photodiode side in the transfer transistor to form side walls SS on the side wall of the gate electrode GET in the transfer transistor of the pixel part and opposite to the photodiode PD and on both side walls of the gate electrode GE in the n-channel type MISFET of the peripheral circuit part. The silicon nitride film SN formed so as to cover the photodiode formation region of the pixel part has a function as an antireflection film and the thickness thereof is approximately 10 to 20 nm, for example.

Next, n-type impurities, for example, arsenide or phosphor, are ion-implanted into the major face of the semiconductor substrate SB in the transfer transistor formation region of the pixel part to form an n-type diffusion layer FD in the semiconductor substrate SB (second p-type well PW2) on the side of the gate electrode GET in the transfer transistor and opposite to the photodiode PD. At the same time, impurities, for example, arsenide or phosphor, are ion-implanted in the major face of the semiconductor substrate SB in the peripheral circuit part to form an n-type diffusion layer SD configuring a source and a drain in the semiconductor substrate SB (second p-type well PW2) on both sides of the gate electrode GE in the n-channel type MIS transistor. Subsequently, a silicide film SL, for example, a cobalt silicide film, is formed on the upper face of the n-type diffusion layer FD formed in the transfer transistor formation region of the pixel part and the upper face of the n-type diffusion layer SD formed in the peripheral circuit part.

Figure 10:
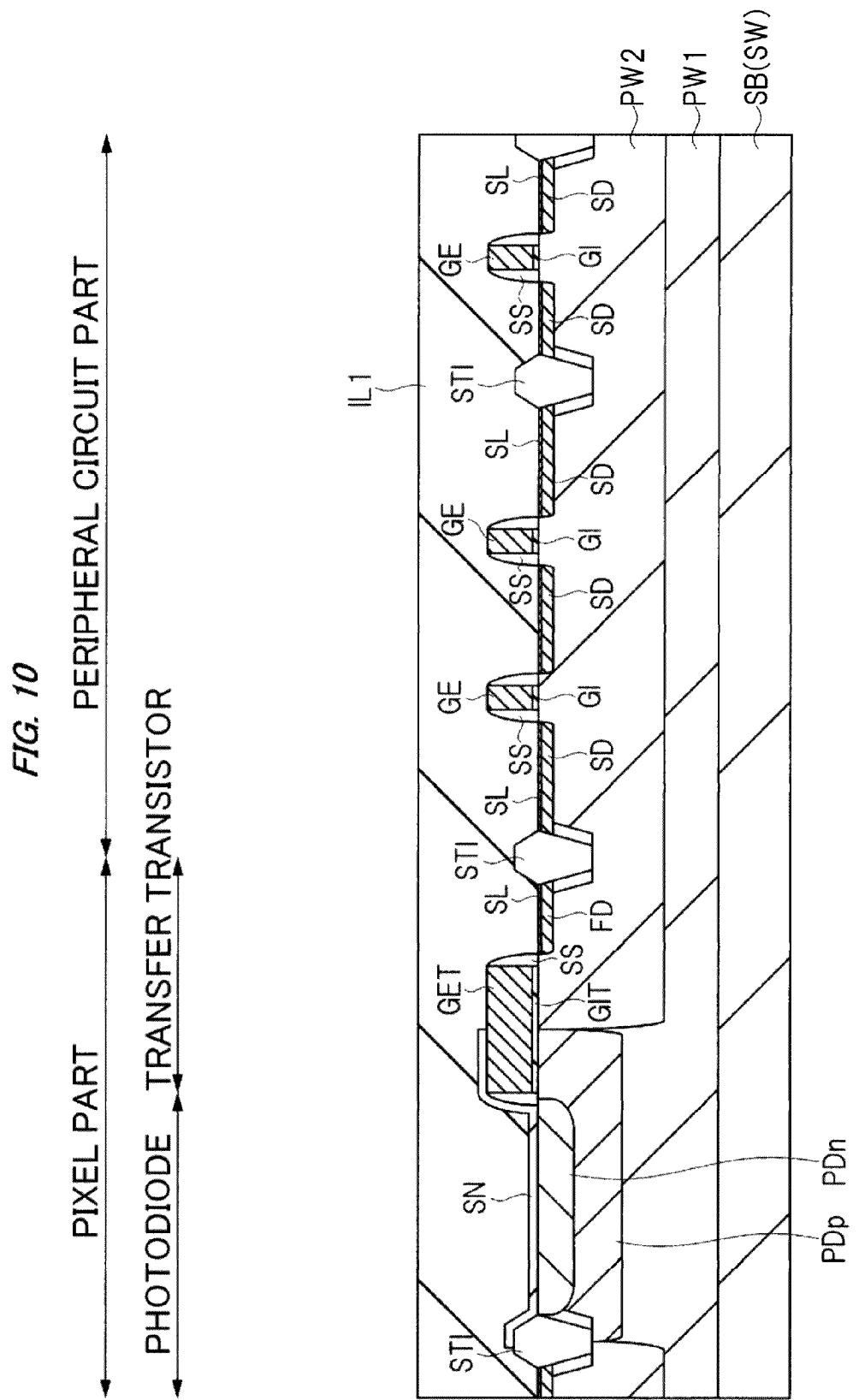
FIG. 10 is a relevant cross-sectional view following FIG. 9, showing a manufacturing step of a semiconductor device.

Next, as shown in FIG. 10, after an interlayer insulating film IL1 made of silicon oxide, for example, has been formed over the major face of the semiconductor substrate SB so as to cover the photodiode and the transfer transistor of the pixel part and the n-channel type MISFET of the peripheral circuit part, the surface of this interlayer insulating film IL1 is made flat by polishing using the CMP method, for example.

Figure 11:
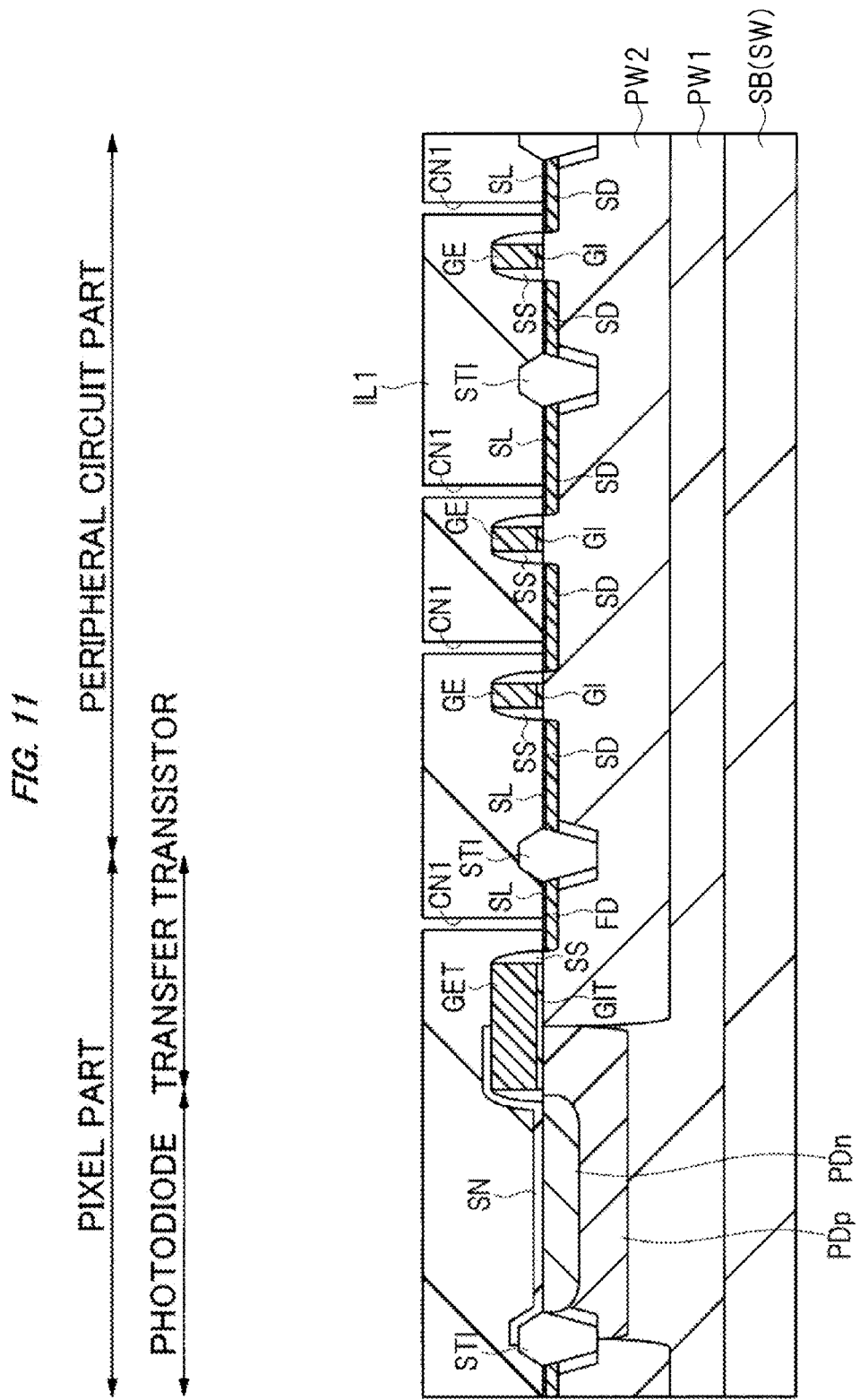
FIG. 11 is a relevant cross-sectional view following FIG. 10, showing a manufacturing step of a semiconductor device.

Next, as shown in FIG. 11, a connection hole CN1 is formed in the interlayer insulating film IL1 by etching with a resist pattern as a mask. The connection hole CN1 is formed at a necessary part such as over the n-type diffusion layer FD in the pixel part and over the n-type diffusion layer SD configuring the source and drain of the n-channel type MIS transistor in the peripheral circuit part.

Figure 12:
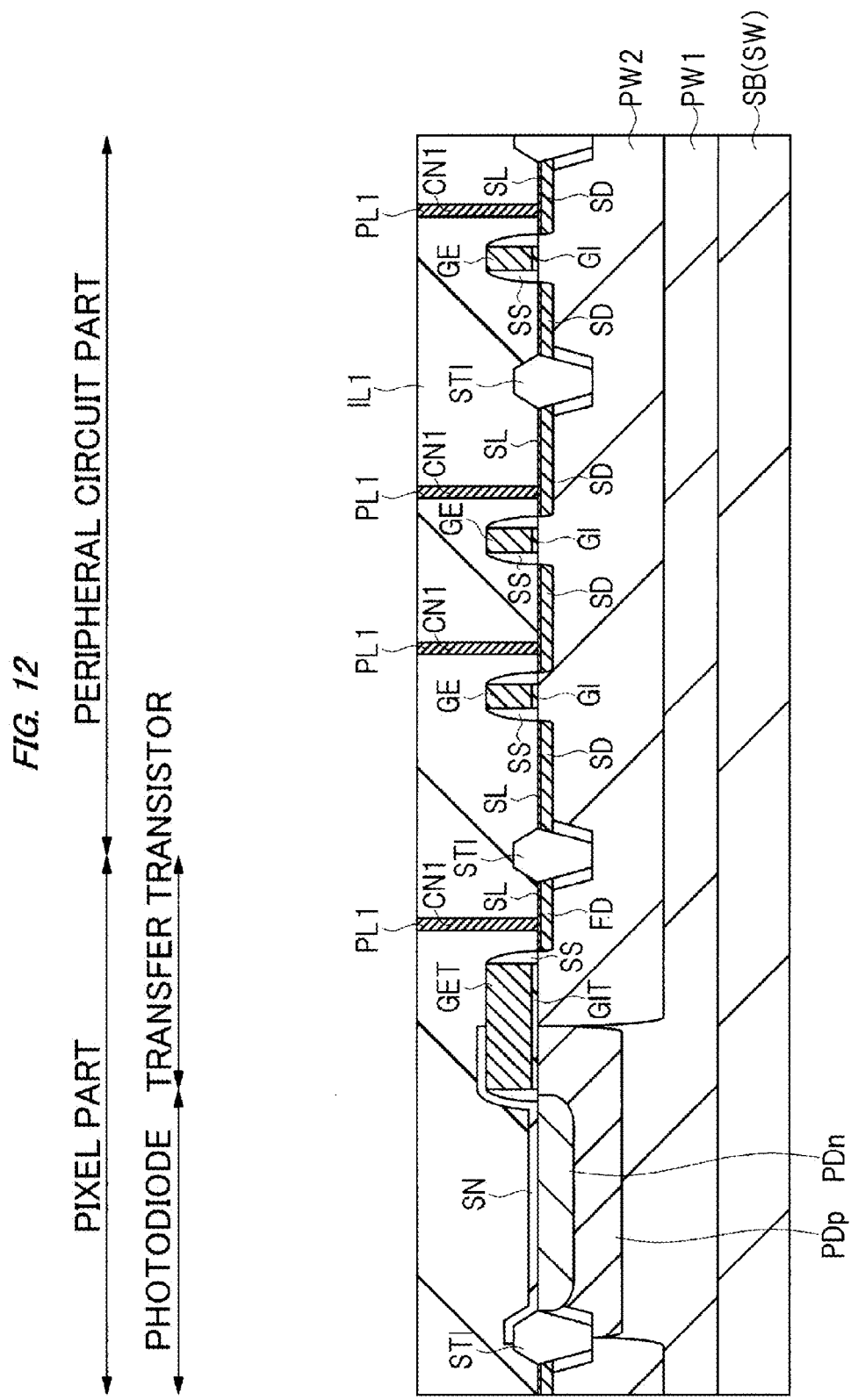
FIG. 12 is a relevant cross-sectional view following FIG. 11, showing a manufacturing step of a semiconductor device.

Next, as shown in FIG. 12, after a metal film, for example, a tungsten film, has been formed over the interlayer insulating film IL1 including the inside of the connection hole CN1, the metal film is polished by the CMP method, for example, to form a plug PL1 inside the connection hole CN1.

Figure 13:
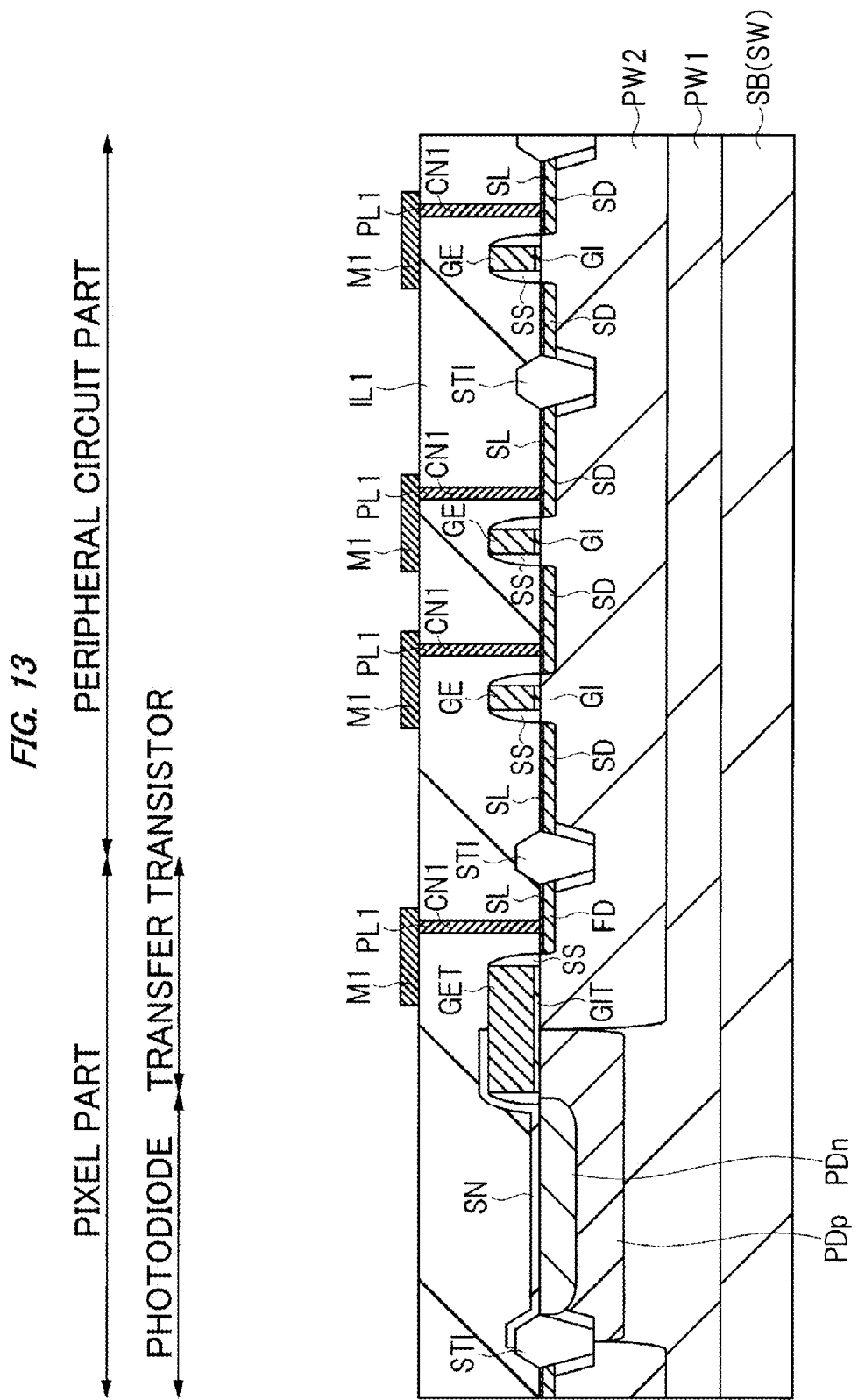
FIG. 13 is a relevant cross-sectional view following FIG. 12, showing a manufacturing step of a semiconductor device.

Next, as shown in FIG. 13, after a metal film, for example, an aluminum alloy film, has been formed over the interlayer insulating film IL1, the metal film is processed by etching with a resist pattern as a mask to form a first layer wiring M1 connected to the plug PL1. The thickness of the first layer wiring M1 is approximately 0.3 µm, for example. The first layer wiring M1 is formed in the transfer transistor formation region of the pixel part and in the peripheral circuit part but is not formed in the photodiode formation region of the pixel part.

Figure 14:
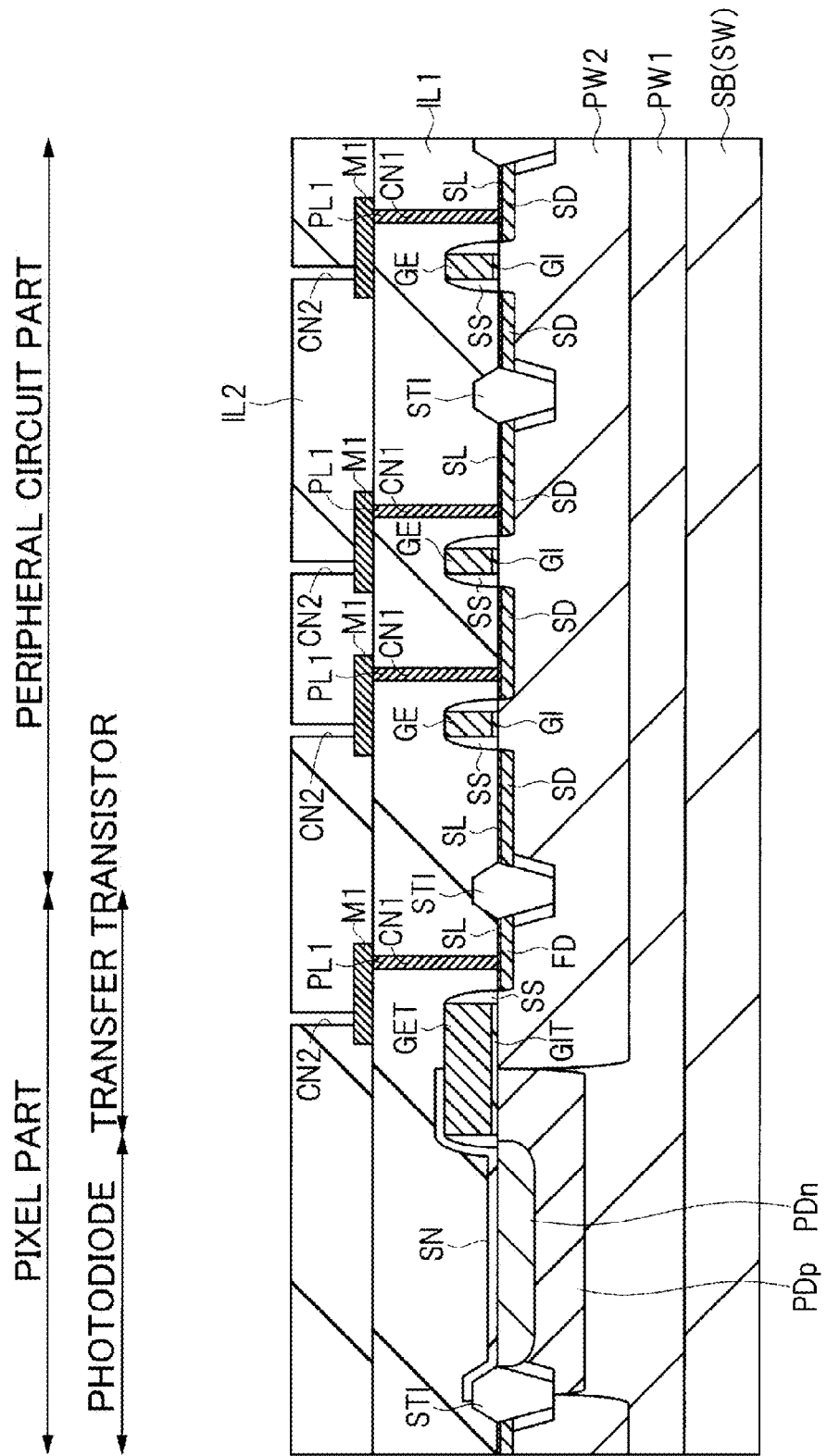
FIG. 14 is a relevant cross-sectional view following FIG. 13, showing a manufacturing step of a semiconductor device.

Next, as shown in FIG. 14, an interlayer insulating film IL2 is formed over the interlayer insulating film IL1 so as to cover the first layer wiring M1. Subsequently, a connection hole CN2 reaching the first layer wiring M1 is formed in the interlayer insulating film IL2 by etching with a resist pattern as a mask.

Figure 15:
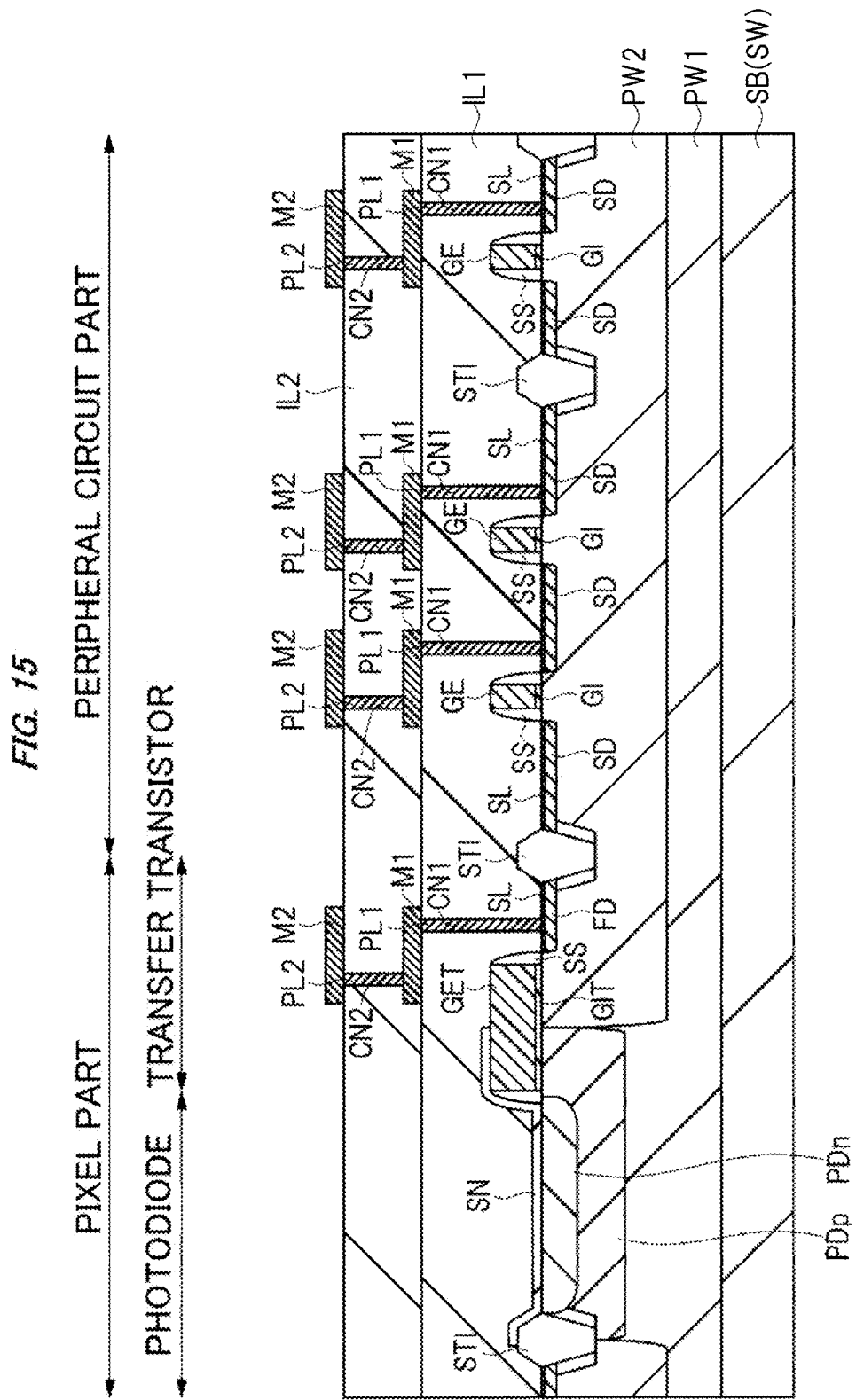
FIG. 15 is a relevant cross-sectional view following FIG. 14, showing a manufacturing step of a semiconductor device.

Next, as shown in FIG. 15, after a metal film, for example, a tungsten film, has been formed over the interlayer insulating film IL2 including the inside of the connection hole CN2, the metal film is polished by the CMP method, for example, to form a plug PL2 inside the connection hole CN2.

Subsequently, after a metal film, for example, an aluminum alloy film, has been formed over the interlayer insulating film IL2, the metal film is processed by etching with a resist pattern as a mask to form a second layer wiring M2 connected to the plug PL2. The thickness of the second layer wiring M2 is approximately 0.3 µm, for example. The second layer wiring M2 is formed in the transfer transistor formation region of the pixel part and in the peripheral circuit part but is not formed in the photodiode formation region of the pixel part.

Figure 16:
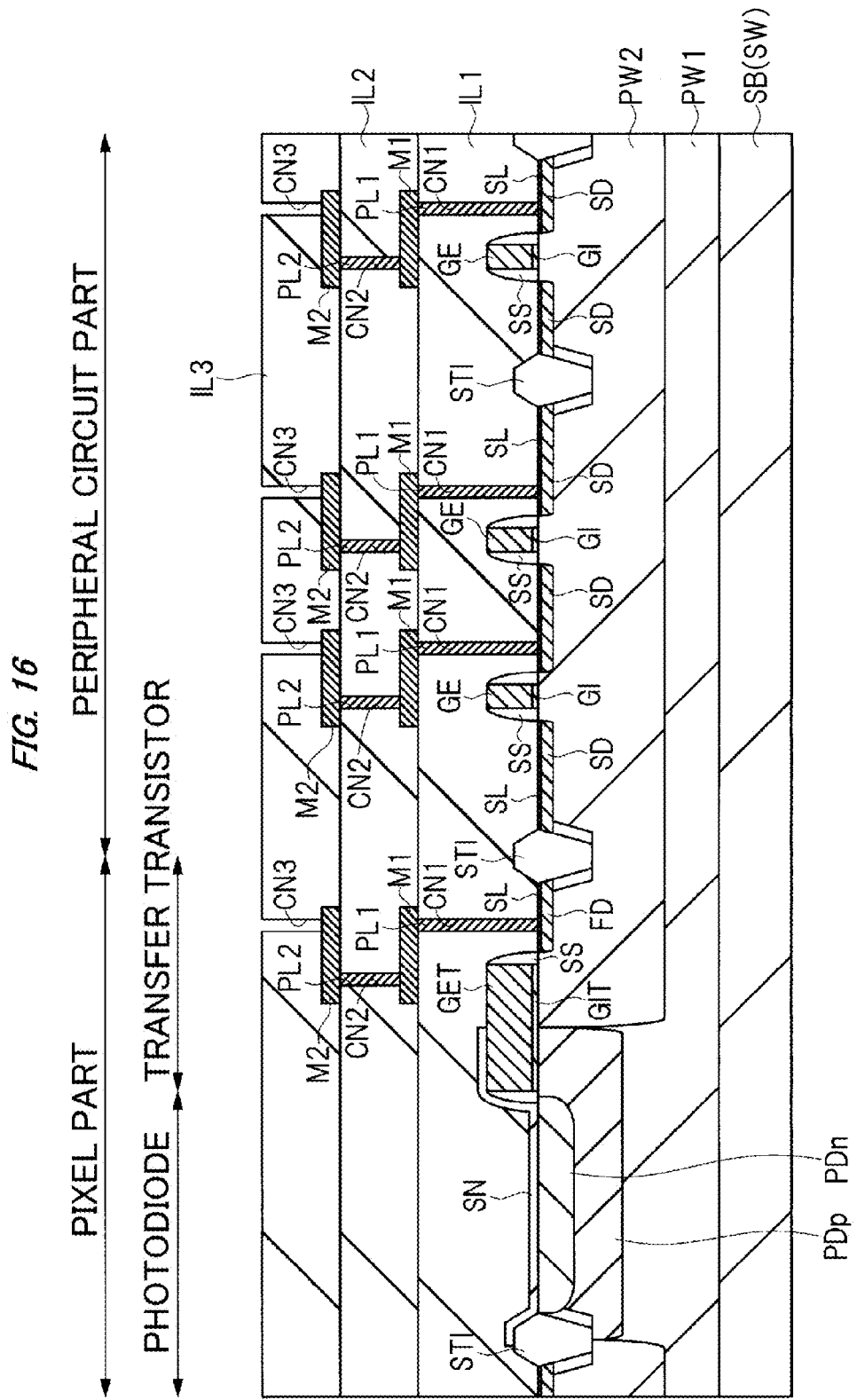
FIG. 16 is a relevant cross-sectional view following FIG. 15 showing a manufacturing step of a semiconductor device.

Next, as shown in FIG. 16, an interlayer insulating film IL3 is formed over the interlayer insulating film IL2 so as to cover the second layer wiring M2. Subsequently, a connection hole CN3 reaching the second layer wiring M2 is formed in the interlayer insulating film IL3 by etching with a resist pattern as a mask.

Figure 17:
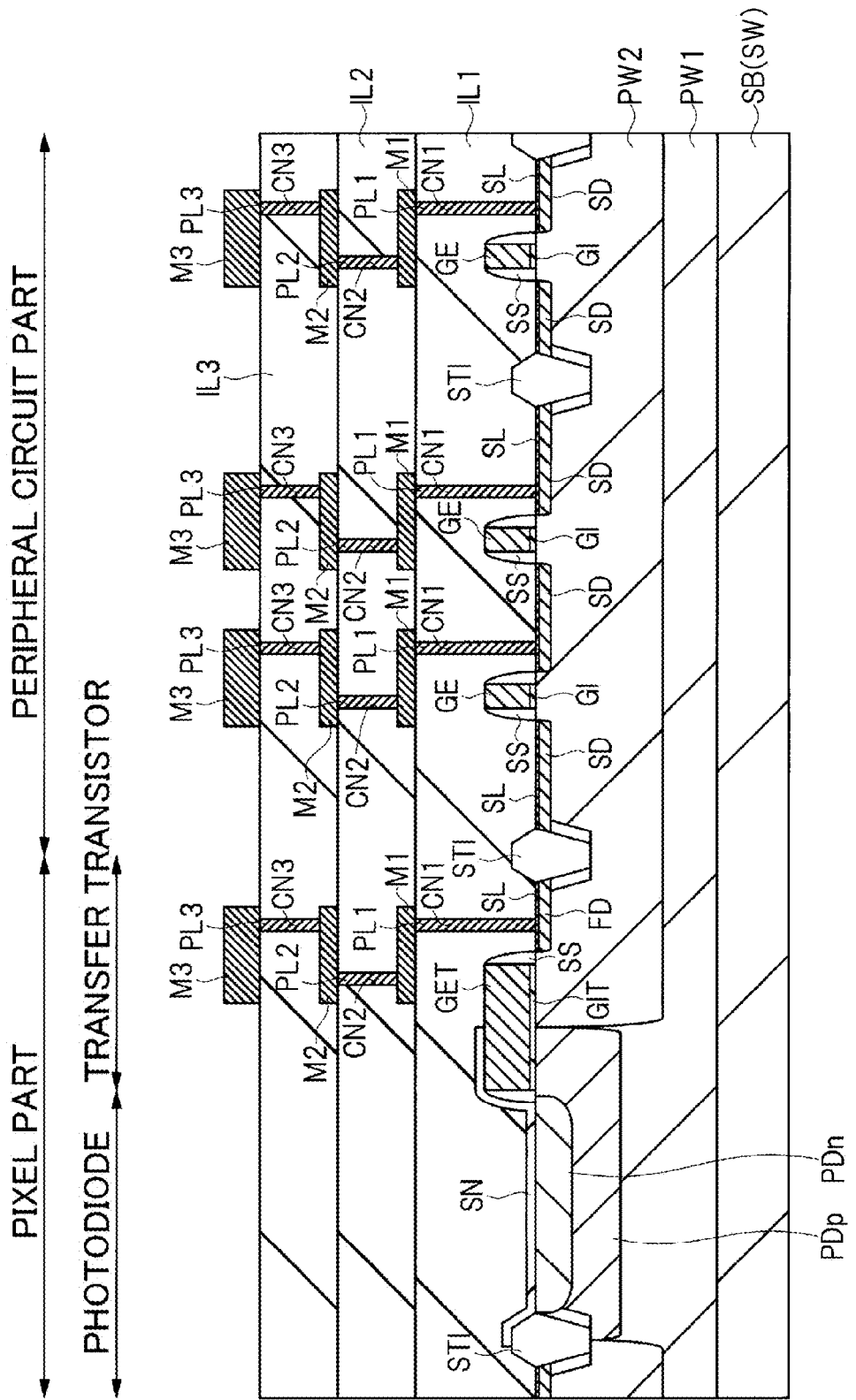
FIG. 17 is a relevant cross-sectional view following FIG. 16 showing a manufacturing step of a semiconductor device.

Next, as shown in FIG. 17, after a metal film, for example, a tungsten film, has been formed over the interlayer insulating film IL3 including the inside of the connection hole CN3, the metal film is polished by the CMP method, for example, to form a plug PL3 inside the connection hole CN3.

Subsequently, a metal film, for example, an aluminum alloy film, has been formed over the interlayer insulating film IL3, then the metal film is processed by etching with a resist pattern as a mask to form a third layer wiring M3 connected to the plug PL3. The thickness of the third layer wiring M3 is approximately 1.0 µm, for example. The third layer wiring M3 is formed in the transfer transistor formation region of the pixel part and in the peripheral circuit part but is not formed in the photodiode formation region of the pixel part.

Subsequently, hydrogen plasma irradiation is carried out using the plasma etching apparatus PEM1 shown in FIG. 1 or the plasma etching apparatus PEM 2 shown in FIG. 2.

For example, after the semiconductor wafer SW has been placed over the lower electrode DE installed within a chamber of the plasma etching apparatus PEM1 shown in FIG. 1, the temperature of the semiconductor wafer SW is set to 0° C. to 60° C. Subsequently, the hydrogen plasma processing is carried out under the following condition; for example, argon gas flow rate/hydrogen gas flow rate: 100 sccm/400 sccm, gas pressure: 70 mT, frequency/power of the first high-frequency power supply: 27 MHz/500 W, frequency/power of the second high-frequency power supply: 2 MHz/1,500 W, and processing time: 300 sec.

Thereby, hydrogen ions existing in the hydrogen plasma move in the interlayer insulating films IL1, IL2, and IL3 by the electric field drift, reach the interface between the semiconductor substrate SB and the silicon nitride film SN in the photodiode formation region of the pixel part, and can terminate the dangling bonds existing at the interface between the semiconductor substrate SB and the silicon nitride film SN with hydrogen. As a result, the number of the surface electron levels generated by the dangling bonds is reduced and the generation of the current path is suppressed, and thereby it is possible to reduce the dark current.

On the other side, while, also in the transfer transistor formation region of the pixel part and in the peripheral circuit part, hydrogen ions are moved by the electric field drift in the interlayer insulating films IL1, IL2, and IL3, since the multilayer wiring (first layer wiring M1, second layer wiring M2, and third layer wiring M3) is formed, this multilayer wiring restricts the movement of the hydrogen ions in the interlayer insulating films IL1, IL2, and IL3. Therefore, the amount of hydrogen ions reaching the semiconductor substrate SB in the transfer transistor formation region of the pixel part and in the peripheral circuit part becomes smaller than the amount of the hydrogen ions reaching the semiconductor substrate SB in the photodiode formation region of the pixel part. Accordingly, in the pixel part, trap level generation by the hydrogen ions is suppressed at the interface between the gate insulating film GIT of the transfer transistor and the semiconductor substrate SB, for example, and the variation of the threshold voltage or the like can be reduced. Similarly, in the peripheral circuit part, trap level generation by the hydrogen ions is suppressed at the interface between the gate insulating film GI of the n-channel type MISFET and the semiconductor substrate SB, for example, and the variation of the threshold voltage or the like can be reduced.

That is, while hydrogen ions become easy to move in the interlayer insulating films IL1, IL2, and IL3 by the electric field drift in the photodiode formation region of the pixel part, hydrogen ions become difficult to move in the interlayer insulating films IL1, IL2, and IL3 by the multilayer wiring (first layer wiring M1, second layer wiring M2, and third layer wiring M3) in the transfer transistor formation region of the pixel part and in the peripheral circuit part. Accordingly, even when the whole semiconductor wafer SW is irradiated with the hydrogen plasma, a large amount of hydrogen ions can be supplied selectively to the photodiode formation region of the pixel part.

Figure 18:
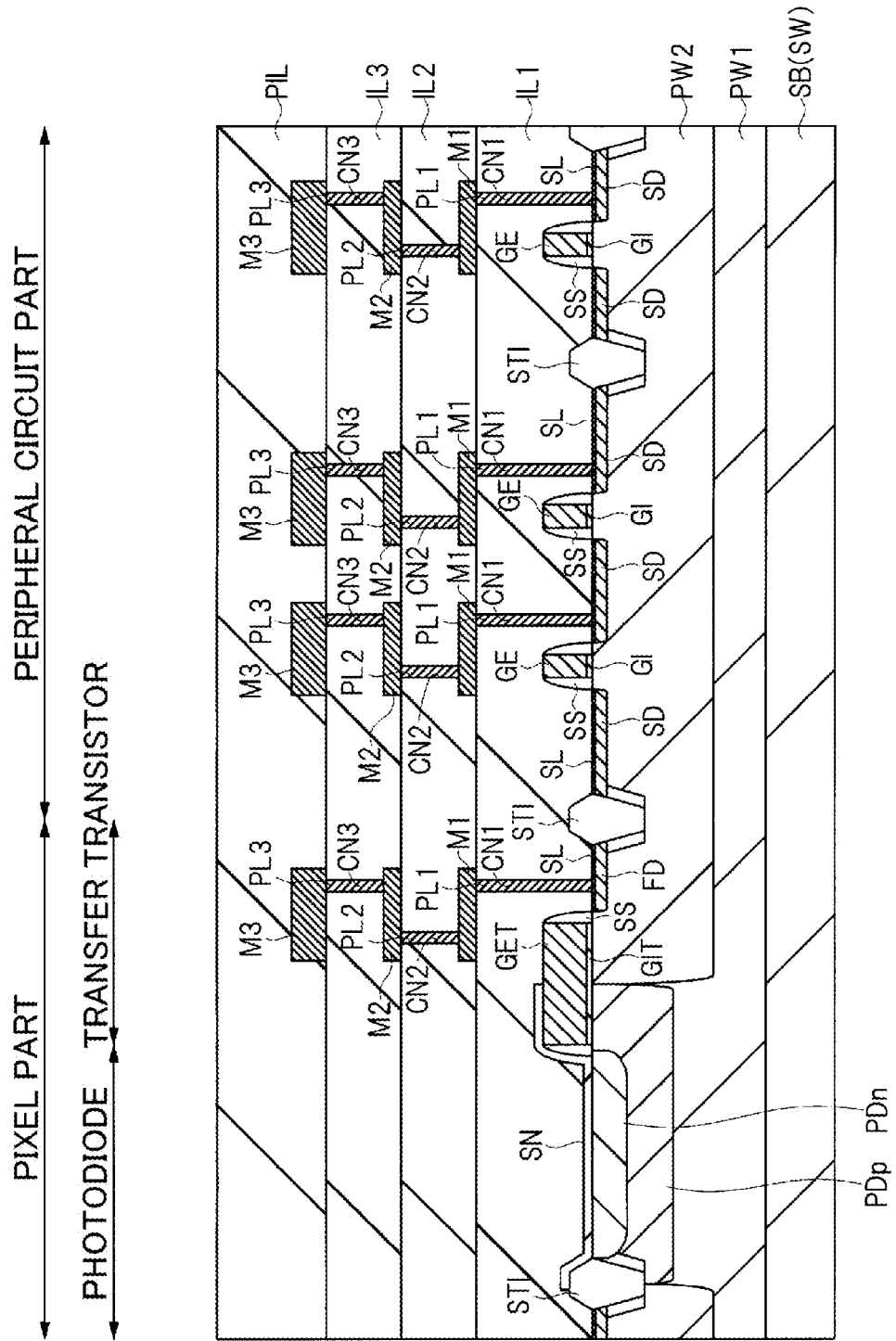
FIG. 18 is a relevant cross-sectional view following FIG. 17 showing a manufacturing step of a semiconductor device.

Next, as shown in FIG. 18, after a protection film PIL has been formed over the interlayer insulating film IL3 so as to cover the third layer wiring M3, the surface of the protection film PIL is made flat by polishing with the CMP method, for example.

Subsequently, while not illustrated in the present first embodiment, a bonding pad is formed over the protection film PIL as a top layer wiring. Here, in the pixel part, the top layer wiring is removed and a color filter and a micro-lens are formed. After that, the semiconductor substrate SB is cut vertically and horizontally along a cutting region and individualized into semiconductor chips, and thereby the semiconductor device incorporating the CMOS image sensor is almost completed.

Note that, while, in the present first embodiment, the hydrogen plasma irradiation is carried out after the third layer wiring M3 has been formed, the hydrogen plasma irradiation may be carried out after the first layer wiring M1 has been formed (refer to FIG. 13) or after the second layer wiring M2 has been formed (refer to FIG. 15). By the hydrogen plasma irradiation carried out after the first layer wiring M1 has been formed, the first layer wiring M1 can restrict the hydrogen ion movement in the interlayer insulating film IL1, and by the hydrogen plasma irradiation carried out after the second layer wiring M2 has been formed, the first layer wiring M1 and the second layer wiring M2 can restrict the hydrogen ion movement in the interlayer insulating films IL1 and IL2. Thereby, in the transfer transistor formation region of the pixel part and in the peripheral circuit part, the amount of hydrogen ions reaching the semiconductor substrate SB is reduced compared with the photodiode formation region of the pixel part.

Further, while, in the present first embodiment, hydrogen ions are supplied to the semiconductor wafer SW by the use of the plasma etching apparatus PEM1 or PEM2, the present invention is not limited to this case, and the hydrogen ions may be supplied by any plasma apparatus including an electrode to which high-frequency power is applied for exciting hydrogen plasma and an electrode to which high-frequency power is applied for supplying the excited hydrogen plasma to the semiconductor wafer SW by the electric field drift. Hydrogen ions may be supplied to the semiconductor wafer SW by the use of a plasma CVD apparatus, for example. When the protection film PIL is formed by an HDP (High Density Plasma)-CVD method, for example, after the protection film PIL has been deposited by the use of the HDP-CVD apparatus, in succession, hydrogen plasma may be excited by the use of the same apparatus and hydrogen ions may be supplied to the semiconductor wafer SW. In this method, since it is not necessary to newly prepare an apparatus to be used for the hydrogen plasma processing, it is possible to reduce manufacturing TAT, and to reduce manufacturing cost.

In this manner, according to the present first embodiment, in the semiconductor device incorporating the CMOS image sensor, it is possible to supply hydrogen ions selectively to the photodiode formation region of the pixel part. That is, while a large amount of hydrogen ions are supplied to the interface between the semiconductor substrate and the insulating film in the photodiode formation region of the pixel part, hydrogen ions become difficult to be supplied to the interface between the semiconductor substrate and the insulating film in the region except the photodiode formation region of the pixel part and in the peripheral circuit part. Thereby, in the photodiode formation region of the pixel part, the number of surface electron levels generated by the dangling bonds is reduced and the generation of the current path is suppressed, and therefore it is possible to reduce the dark current. On the other side, in the region except the photodiode formation region of the pixel part and in the peripheral circuit part, the supply of hydrogen ions is suppressed and the trap level generation is reduced, and therefore it is possible to prevent deterioration of device characteristics such as the variation of the threshold voltage in a field effect transistor, for example.

Second Embodiment

While, in the above first embodiment, each of the first layer wiring M1, the second layer wiring M2, and the third layer wiring M3 is formed by means of processing a metal film by the lithography technique and the etching technique, the present invention is not limited to this case. For example, the multilayer wiring (first layer wiring M1, second layer wiring M2, and third layer wiring M3) may be formed by a damascene method.

Figure 19:
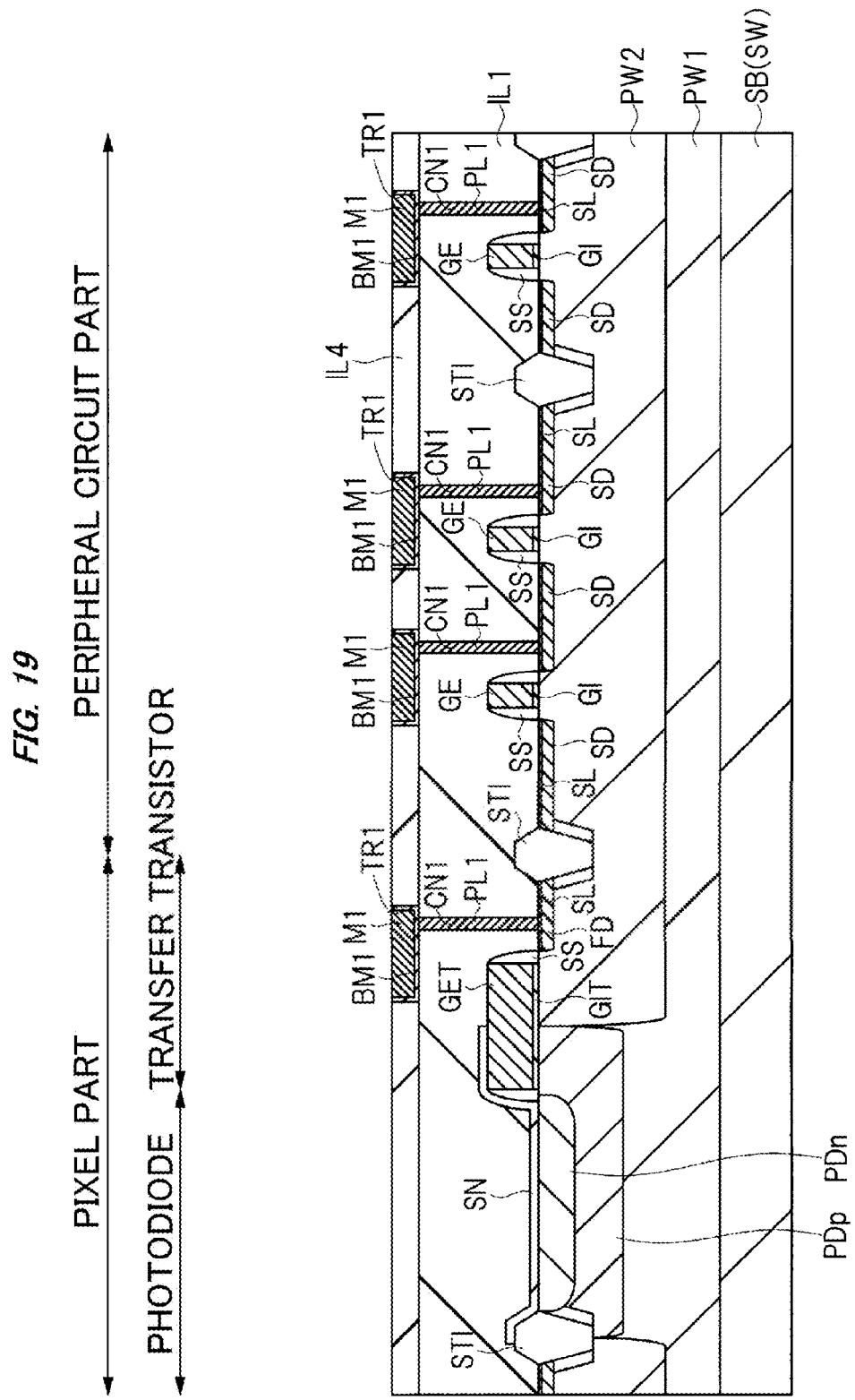
FIG. 19 is a relevant cross-sectional view showing a manufacturing step of a semiconductor device according to a second embodiment.
Figure 20:
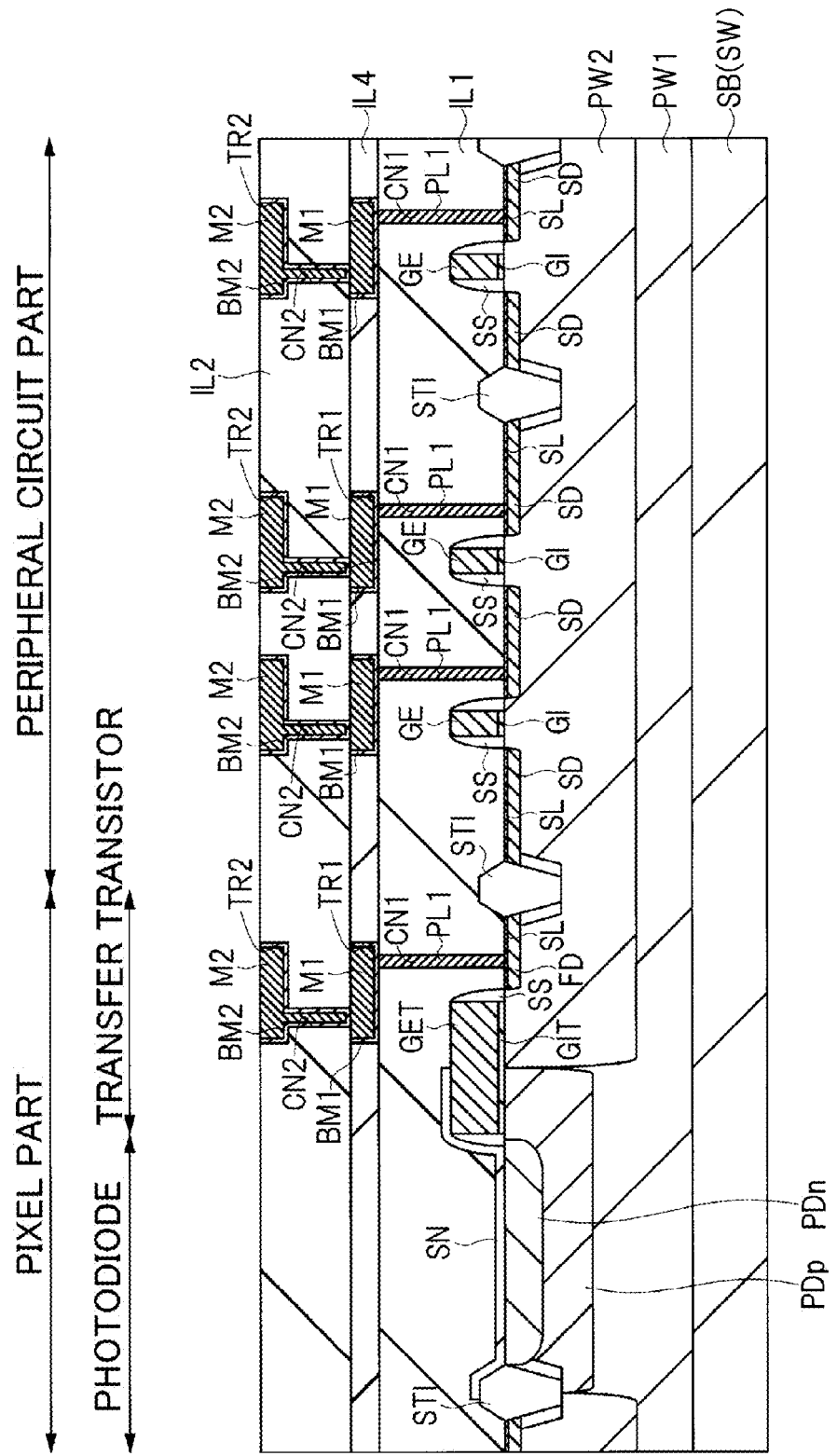
FIG. 20 is a relevant cross-sectional view following FIG. 19, showing a manufacturing step of a semiconductor device.

In the following, there will be explained a manufacturing method of a semiconductor device including a multilayer wiring formed by the damascene method according to the second embodiment, by the use of FIG. 19 to FIG. 21. FIG. 19 to FIG. 21 are relevant cross-sectional views showing manufacturing steps of a semiconductor device according to the present second embodiment. Note that the manufacturing steps before the first layer wiring is formed are the same as those of the above first embodiment, and the explanation thereof will be omitted.

First, the first layer wiring M1 is formed by a single damascene method.

As shown in FIG. 19, an insulating film IL4 is formed over the interlayer insulating film IL1 in which the plug PL1 is formed, and a wiring trench TR1 having a concave shape is formed in a predetermined region of the insulating film IL4 by dry etching with a resist pattern as a mask.

Next, a barrier metal film BM1 is formed over the insulating film IL4 including the inner wall of the wiring trench TR1 (side face and bottom face). The barrier metal film BM1 is a titanium nitride (TiN) film, a tantalum (Ta) film, a tantalum nitride (TaN) film, or the like, for example. Subsequently, a seed layer of Cu (illustration is omitted) is formed over the barrier metal film BM1 by a CVD method or a sputtering method, further a Cu plating film is formed over the seed layer by the use of electroplating method, and the inside of the wiring trench TR1 is filled by the Cu plating film. Subsequently, the Cu plating film, the seed layer, and the barrier metal film BM1 are removed by the CMP method from the region except the inside of the wiring trench TR1, and the first layer wiring M1 with the Cu film as a main conductor is formed. Note that, while, in the present second embodiment, the Cu film which is a main conductor configuring the first layer wiring M1 is formed by the electroplating method, the Cu film may be formed by a CVD method, a sputtering method, sputter-reflow method, or the like. Here, the first layer wiring M1 is formed in the transfer transistor formation region of the pixel part and in the peripheral circuit part but is not formed in the photodiode formation region of the pixel part, as in the above first embodiment.

After that, an ammonia treatment is carried out using the plasma etching apparatus PEM0 shown in FIG. 3, for example, and a barrier metal layer (illustration is omitted) is formed on the surface of the first layer wiring M1 by nitriding the surface of the first layer wiring M1.

Next, the second layer wiring M2 is formed by a dual damascene method.

As shown in FIG. 20, the interlayer insulating film IL2 is formed over the insulating film IL4 in which the first layer wiring M1 is formed. The interlayer insulating film IL2 can be a TEOS (Tetra Ethyl Ortho Silicate) film formed by a plasma CVD method, for example. Subsequently, after the connection hole CN2 has been formed in a predetermined region of the interlayer insulating film IL2 by dry etching with a resist pattern for forming the hole as a mask, a wiring trench TR2 is formed in a predetermined region of the interlayer insulating film IL2 by dry etching with a resist pattern for forming the wiring trench as a mask.

Next, a barrier metal film BM2 is formed over the interlayer insulating film IL2 including each of the inside walls (side face and bottom face) in the connection hole CN2 and the wiring trench TR2. The barrier metal film BM2 is a titanium nitride (TiN) film, a tantalum (Ta) film, a tantalum nitride (TaN) film or the like, for example. Subsequently, a seed layer of Cu (illustration is omitted) is formed over the barrier metal film BM2 by the CVD method or the sputtering method, further a Cu plating film is formed over the seed layer by the use of the electroplating method, and the insides of the connection hole CN2 and the wiring trench TR2 are filled by the CU plating film. Subsequently, the Cu plating film, the seed layer, and the barrier metal film BM2 are removed by the CMP method from the region except the insides of the connection hole CN2 and the wiring trench TR2, and the second layer wiring M2 with the Cu film as a main conductor is formed. A connection member connecting this second layer wiring M2 and the first layer wiring M1 is integrally formed with the second layer wiring M2. Here, the second layer wiring M2 is formed in the transfer transistor formation region of the pixel part and in the peripheral circuit part but is not formed in the photodiode formation region of the pixel part, as in the above first embodiment.

After that, the ammonia treatment is carried out using the plasma etching apparatus PEM0 shown in FIG. 3, for example, and a barrier metal layer (illustration is omitted) is formed on the surface of the second layer wiring M2 by nitriding the surface of the second layer wiring M2.

Next, as shown in FIG. 21, the third layer wiring M3 is formed by the same method as that of the above second layer wiring M2, for example. That is, after the interlayer insulating film IL3 has been formed over the interlayer insulating film IL2 where the second layer wiring M2 is formed, the connection hole CN3 and a wiring trench TR3 are formed in the interlayer insulating film IL3. Subsequently, a barrier metal film BM3 and the third layer wiring M3 are formed inside the connection hole CN3 and the wiring trench TR3. Here, the third layer wiring M3 is formed in the transfer transistor formation region of the pixel part and in the peripheral circuit part but is not formed in the photodiode formation region of the pixel part, as in the above first embodiment.

After that, the ammonia treatment is carried out using the plasma etching apparatus PEM0 shown in FIG. 3, for example, and a barrier metal layer (illustration is omitted) is formed on the surface of the third layer wiring M3 by nitriding the surface of the third layer wiring M3.

Next, as in the above first embodiment, the hydrogen plasma irradiation is carried out using the plasma etching apparatus PEM1 shown in FIG. 1 or the plasma etching apparatus PEM2 shown in FIG. 2.

Thereby, hydrogen ions move in the interlayer insulating films IL1, IL2, and IL3 by the electric field drift, reach the interface between the semiconductor substrate SB and the silicon nitride film SN in the photodiode formation region of the pixel part, and the dangling bonds existing at the interface between the semiconductor substrate SB and the silicon nitride film SN can be terminated with hydrogen. As a result, the number of surface electron levels generated by the dangling bonds is reduced, the generation of the current path is suppressed, and it is possible to reduce the dark current.

On the other side, in the transfer transistor formation region of the pixel part and in the peripheral circuit part, the multilayer wiring (first layer wiring M1, second layer wiring M2, and third layer wiring M3) restricts the movement of hydrogen ions in the interlayer insulating films IL1, IL2, and IL3. Therefore, the amount of hydrogen ions reaching the semiconductor substrate SB in the transfer transistor formation region of the pixel part and in the peripheral circuit part becomes smaller than the amount of the hydrogen ions reaching the semiconductor substrate SB in the photodiode formation region of the pixel part. That is, even if the whole semiconductor wafer SW is irradiated with the hydrogen plasma, a large amount of hydrogen ions can be supplied selectively to the photodiode formation region of the pixel part.

After that, as in the above first embodiment, after a protection film or the like has been formed, the semiconductor substrate SB is cut vertically and horizontally along the cutting region to be individualized into the semiconductor chips, and thereby the semiconductor device incorporating the CMOS image sensor is almost completed.

Note that, while the hydrogen plasma irradiation is carried out after the third layer wiring M3 has been formed, in the present second embodiment, the hydrogen plasma irradiation may be carried out after the first layer wiring M1 has been formed (refer to FIG. 19) or after the second layer wiring M2 has been formed (refer to FIG. 20). By the hydrogen plasma irradiation carried out after the first layer wiring M1 has been formed, the first layer wiring M1 can restrict the hydrogen ion movement in the interlayer insulating film IL1, and, by the hydrogen plasma irradiation carried out after the second layer wiring M2 has been formed, the first layer wiring M1 and the second layer wiring M2 can restrict the hydrogen ion movement in the interlayer insulating films IL1 and IL2, and the insulating film IL4. Thereby, in the transfer transistor formation region of the pixel part and in the peripheral circuit part, the amount of hydrogen ions reaching the semiconductor substrate SB is reduced compared with the photodiode formation region of the pixel part.

In the present second embodiment, after the first layer wiring M1, the second layer wiring M2, or the third layer wiring M3 has been formed, the ammonia treatment is carried out using the plasma etching apparatus PEM0 shown in FIG. 3, for example. Since, also in this case, hydrogen ions are supplied to the photodiode formation region of the pixel part and the dangling bonds existing at the interface between the semiconductor substrate SB and the silicon nitride film SN can be terminated with hydrogen, if most of the dangling bonds are terminated with hydrogen in the ammonia treatment, it is not necessary to carry out the hydrogen plasma irradiation. However, for supplying a large amount of hydrogen ions to the photodiode formation region of the pixel part, it is preferable to carry out the hydrogen plasma processing after the first layer wiring M1, the second layer wiring M2, and the third layer wiring M3 have been formed, using the plasma etching apparatus PEM1 shown in FIG. 1 or the plasma etching apparatus PEM2 shown in FIG. 2.

In this manner, according to the present second embodiment, also in the semiconductor device which incorporates the CMOS image sensor and has the damascene wirings, it is possible to obtain the same effect as that of the above first embodiment.

Third Embodiment

In the region except the photodiode formation region of the pixel part and in the peripheral circuit part, it is preferable not to supply hydrogen ions for suppressing the trap level generation. However, sometimes it is preferable to supply a small amount of hydrogen ions also to the region except the photodiode formation region of the pixel part and to the peripheral circuit part. In such a case, before the formation of the wirings, hydrogen ions are supplied to the whole surface of the pixel part and the peripheral circuit part, and further, after the formation of the wirings, the hydrogen plasma processing is carried out and hydrogen ions are supplied selectively to the photodiode formation region of the pixel part as in the above first embodiment.

For example, the first hydrogen plasma processing is carried out in any timing after the interlayer insulating film IL1 has been formed over the major face of the semiconductor substrate SB as shown in FIG. 10, after the connection hole CN1 has been formed in the interlayer insulating film IL1 as shown in FIG. 11, and after the plug PL1 has been formed inside the connection hole CN1 as shown in FIG. 12. Here, hydrogen ions having a desired concentration are supplied to the whole surface of the pixel part and the peripheral circuit part. This first plasma processing may use the plasma etching apparatus PEM1 shown in FIG. 1 or the plasma etching apparatus PEM2 shown in FIG. 2.

The process steps after that are the same as those in the above first embodiment, and, after the first layer wiring M1, the second layer wiring M2, or the third layer wiring M3 has been formed, the second hydrogen plasma processing is carried out using the plasma etching apparatus PEM1 shown in FIG. 1 or the plasma etching apparatus PEM2 shown in FIG. 2. Here, hydrogen ions having a desired concentration are supplied selectively to the photodiode formation region of the pixel part.

In this manner, according to the present third embodiment, the first hydrogen plasma processing and the second hydrogen plasma processing are carried out in the photodiode formation region of the pixel part, and the first hydrogen plasma processing is carried out in the region except the photodiode formation region of the pixel part and in the peripheral circuit part. Accordingly, a relatively large amount of hydrogen ions can be supplied to the photodiode formation region of the pixel part, and a relatively small amount of hydrogen ions can be supplied to the region except the photodiode formation region of the pixel part and to the peripheral circuit part.

While, in the above, the invention achieved by the present inventors has been explained specifically according to the embodiments, the present invention is not limited to the above embodiments, and obviously can be modified variously in a range without departing from the gist thereof.

What is claimed is:

1. A manufacturing method of a semiconductor device, comprising the steps of:
    (a) preparing a semiconductor substrate having a first face and a second face opposite to the first face;
    (b) forming a first element part and a second element part in respective regions different from each other in the first face of the semiconductor substrate;
    (c) after the step (b), forming a wiring in the second element part; and (d) after the step (c), mounting the semiconductor substrate in a plasma apparatus provided with an upper electrode and a lower electrode facing each other, over the lower electrode, while bringing the lower electrode and the second face of the semiconductor substrate into contact with each other, so as to generate hydrogen plasma between the first face of the semiconductor substrate and the upper electrode, wherein the step (d) further includes the steps of:
(d1) applying a first high-frequency power to the upper electrode or the lower electrode so as to generate the hydrogen plasma;
(d2) applying a second high-frequency power to the lower electrode so as to supply hydrogen ions existing in the hydrogen plasma to an interface between the first face of the semiconductor substrate in the first element part and a first insulating film formed over the first face of the semiconductor substrate in the first element part.

2. The manufacturing method of a semiconductor device according to claim 1,
wherein a frequency of the first high-frequency power is in a range of 27 MHz to 60 MHz, and a frequency of the second high-frequency power is in a range of 2 MHz to 27 MHz.

3. The manufacturing method of a semiconductor device according to claim 1,
wherein the first high-frequency power is in a range of 200 W to 5,000 W, and the second high-frequency power is in a range of 200 W to 5,000 W.

4. The manufacturing method of a semiconductor device according to claim 1,
wherein, further in the step (d2),
hydrogen ions existing in the hydrogen plasma are supplied to an interface between the first face of the semiconductor substrate in the second element part and a second insulating film formed over the first face of the semiconductor substrate in the second element part, and
a concentration of the hydrogen ions supplied to the interface between the first face of the semiconductor substrate in the first element part and the first insulating film is higher than a concentration of the hydrogen ions supplied to the interface between the first face of the semiconductor substrate in the second element part and the second insulating film.

5. The manufacturing method of a semiconductor device according to claim 1, further comprising the step of
(e) between the step (c) and the step (d), forming a protection film over the wiring across the first element part and the second element part.

6. The manufacturing method of a semiconductor device according to claim 1,
wherein in the first element part, a photodiode is formed which includes a first region of a first conductivity type having a first depth from the first face of the semiconductor substrate and a second region of a second conductivity type formed within the first region and having a second depth, which is smaller than the first depth, from the first face of the semiconductor substrate.

7. A manufacturing method of a semiconductor device, comprising:
a) providing a semiconductor substrate having a major semiconductor surface exhibiting dangling bonds,
said semiconductor surface having a first surface portion with a photodiode formed therein and an insulating film on the first surface portion forming a first interface with the semiconductor surface, whereby the dangling bonds at the first interface permit a flow of dark current from the photodiode,
said semiconductor surface having a second surface portion having at least one MIS transistor, said MIS transistor having a gate electrode and a gate insulating film, the gate insulating film having a second interface with the semiconductor surface,
at least one wiring layer being disposed over the at least one MIS transistor; and
b) implanting hydrogen ions simultaneously into both the first and second surface portions of the semiconductor surface by electric field drift, with the amount of hydrogen ions reaching the first interface being sufficient to decrease the flow of dark current from the photodiode, and with the wiring layer serving to limit the amount of hydrogen reaching the second interface to a lesser amount.

8. The manufacturing method of a semiconductor device according to claim 7, wherein the hydrogen ions are provided by hydrogen plasma.

9. The manufacturing method of a semiconductor device according to claim 7, wherein the hydrogen ions are provided by ammonia plasma.

* * * * *